(12) United States Patent
Yoo et al.

(10) Patent No.: US 12,707,774 B2
(45) Date of Patent: Aug. 11, 2026

(54) DISPLAY DEVICE

(71) Applicant: LG ELECTRONICS INC., Seoul (KR)

(72) Inventors: Younggil Yoo, Seoul (KR); Gunyoung Hong, Seoul (KR); Minsung Kim, Seoul (KR); Kyungpil Kim, Seoul (KR); Bokyung Kang, Seoul (KR); Seungmi Baek, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 422 days.

(21) Appl. No.: 18/570,868

(22) PCT Filed: Jun. 18, 2021

(86) PCT No.: PCT/KR2021/007676
§ 371 (c)(1),
(2) Date: Dec. 15, 2023

(87) PCT Pub. No.: WO2022/265138
PCT Pub. Date: Dec. 22, 2022

(65) Prior Publication Data

US 2024/0282892 A1 Aug. 22, 2024

(51) Int. Cl.
*H10H 20/851* (2025.01)
*H10W 90/00* (2026.01)

(52) U.S. Cl.
CPC ........ *H10H 20/8515* (2025.01); *H10W 90/00* (2026.01)

(58) Field of Classification Search
CPC .. H10H 20/8515; H10H 20/85; H10H 20/851; H10H 20/8513; H10H 29/10;
(Continued)

(56) References Cited

U.S. PATENT DOCUMENTS 10,325,963 B2 * 6/2019 Lin ........................ H10K 59/38
11,004,892 B2 * 5/2021 Kim .................... H10H 29/142
(Continued)

FOREIGN PATENT DOCUMENTS

JP 2016-218151 A 12/2016
KR 10-2012-0122645 A 11/2012
(Continued)

OTHER PUBLICATIONS

International Search Report (PCT/ISA/210) issued in PCT/KR2021/007676, dated Mar. 14, 2022.

*Primary Examiner* — Allison Bernstein
(74) *Attorney, Agent, or Firm* — Birch, Stewart, Kolasch & Birch, LLP

(57) ABSTRACT

The display device includes a light source that generates first light, a conversion layer that outputs a plurality of lights using the first light, and a color filter layer.

The conversion layer includes first to third conversion layers, and the color filter layer includes first to third color filters. The first conversion layer and the second conversion layer may include the same material.

The first conversion layer and the first color filter may convert the first dominant wavelength of the first light to output second light having a second frequency. The second dominant wavelength of the second light may be located at the first color vertex of the color reproduction rate standard.

19 Claims, 13 Drawing Sheets

(58) Field of Classification Search
CPC ........... H10H 20/8506; H10H 20/8512; H10H 20/8514; H10W 90/00; G02B 5/20; C09K 11/08
See application file for complete search history.

(56) References Cited

U.S. PATENT DOCUMENTS

| | | | | |
|---|---|---|---|---|
| 11,703,706 | B2 * | 7/2023 | Kim .................. | H10H 20/8514 349/106 |
| 2011/0069369 | A1 | 3/2011 | Park et al. | |
| 2014/0124802 | A1 | 5/2014 | Do et al. | |
| 2016/0062183 | A1 | 3/2016 | Sung et al. | |
| 2016/0211245 | A1 | 7/2016 | Do | |
| 2017/0068127 | A1 | 3/2017 | Lee et al. | |
| 2019/0035856 | A1 | 1/2019 | Lee | |
| 2019/0140016 | A1 | 5/2019 | Hwang et al. | |
| 2022/0209193 | A1 * | 6/2022 | Shin ...................... | H10W 90/00 |
| 2022/0352247 | A1 * | 11/2022 | Song .................... | H10H 29/142 |

FOREIGN PATENT DOCUMENTS

| | | | |
|---|---|---|---|
| KR | 10-1436123 | B1 | 11/2014 |
| KR | 10-2015-0020646 | A | 2/2015 |
| KR | 10-2016-0028263 | A | 3/2016 |
| KR | 10-2017-0029066 | A | 3/2017 |
| KR | 10-2018-0099991 | A | 9/2018 |
| KR | 10-2019-0011462 | A | 2/2019 |
| KR | 10-2019-0052887 | A | 5/2019 |
| KR | 10-1969462 | B1 | 8/2019 |

* cited by examiner

[FIG. 1]
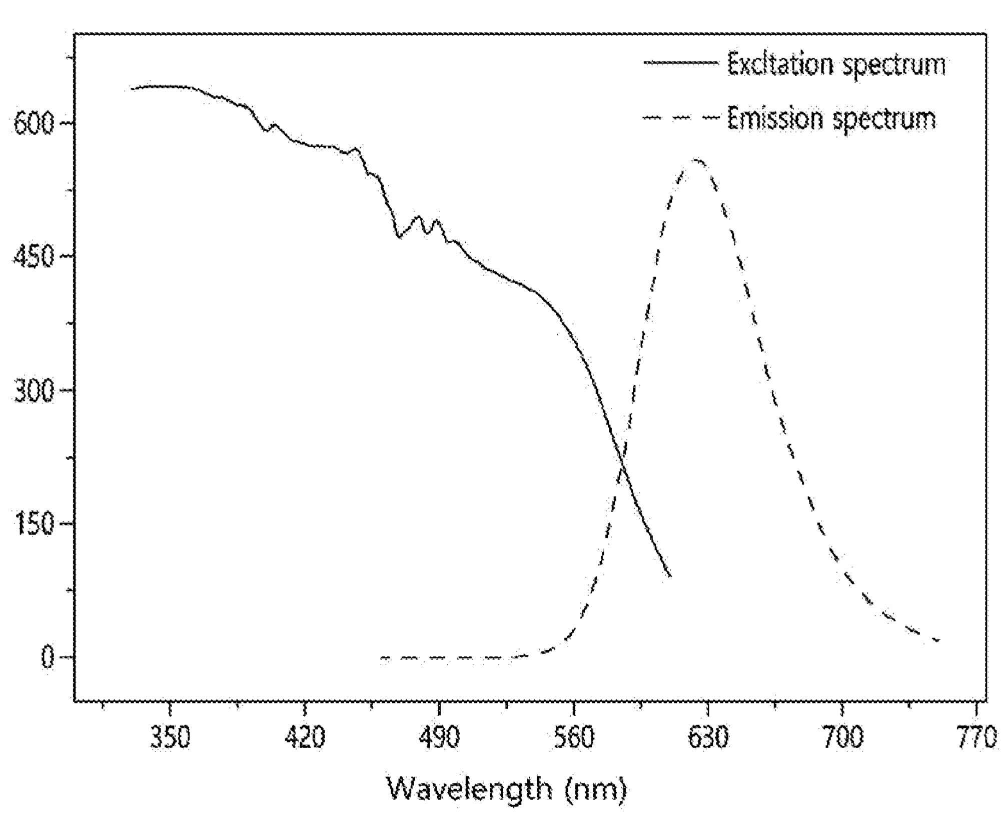

[FIG. 2]
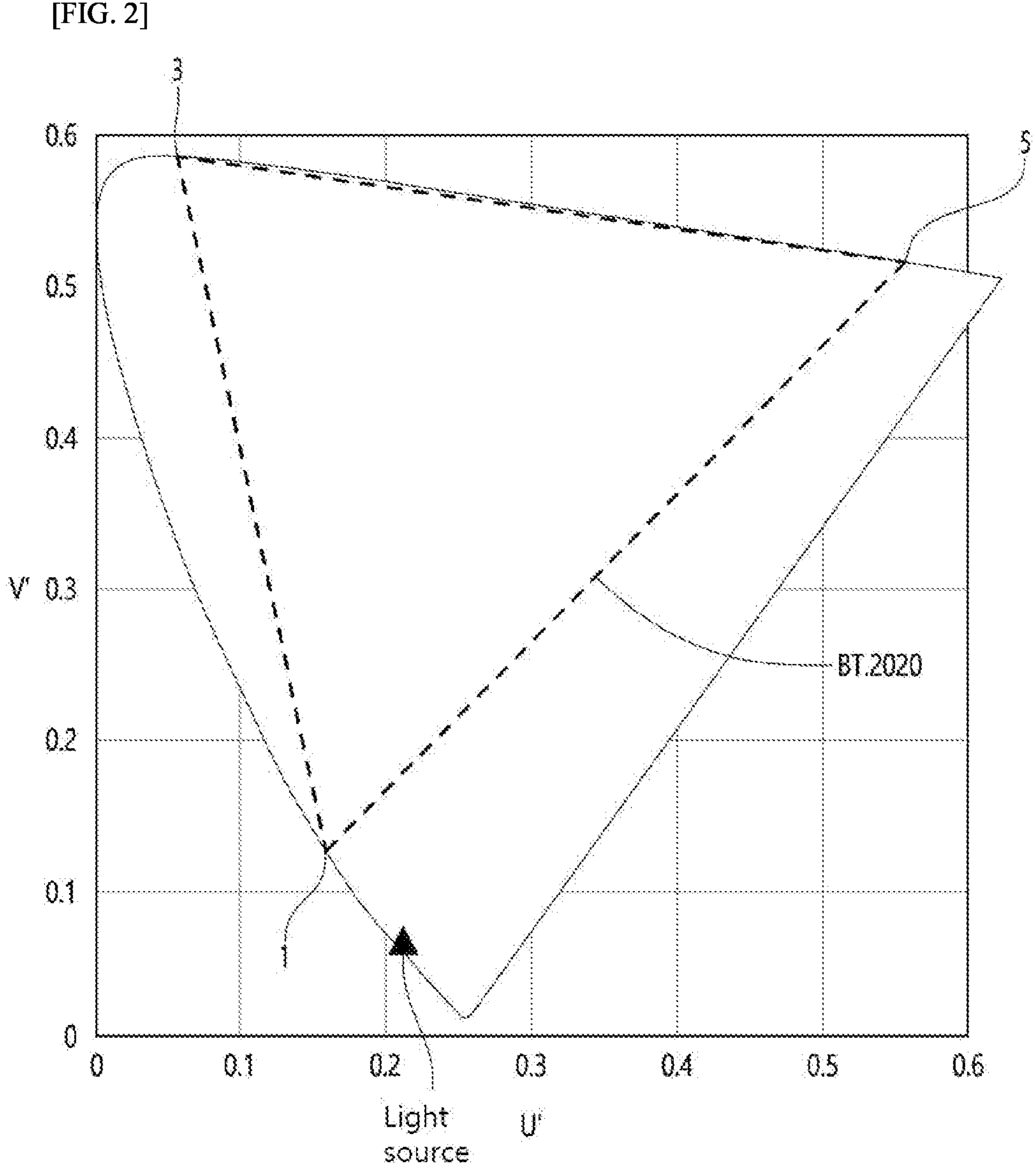

[FIG. 3]
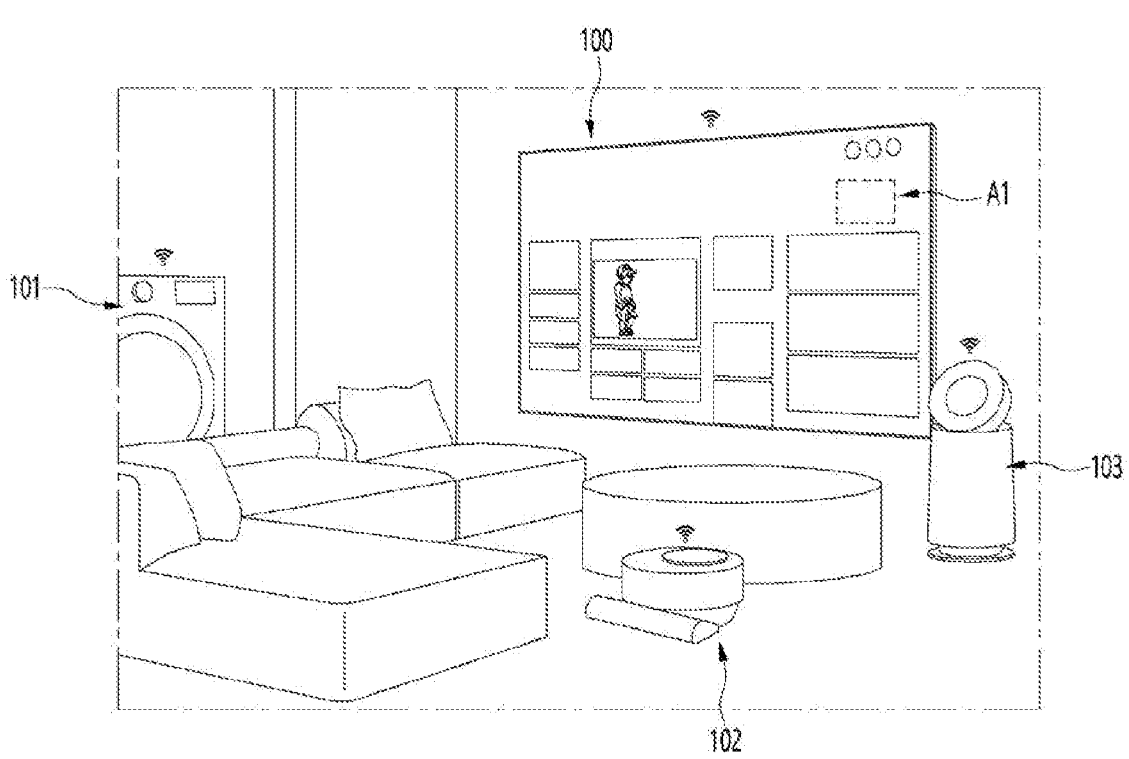

[FIG. 4]
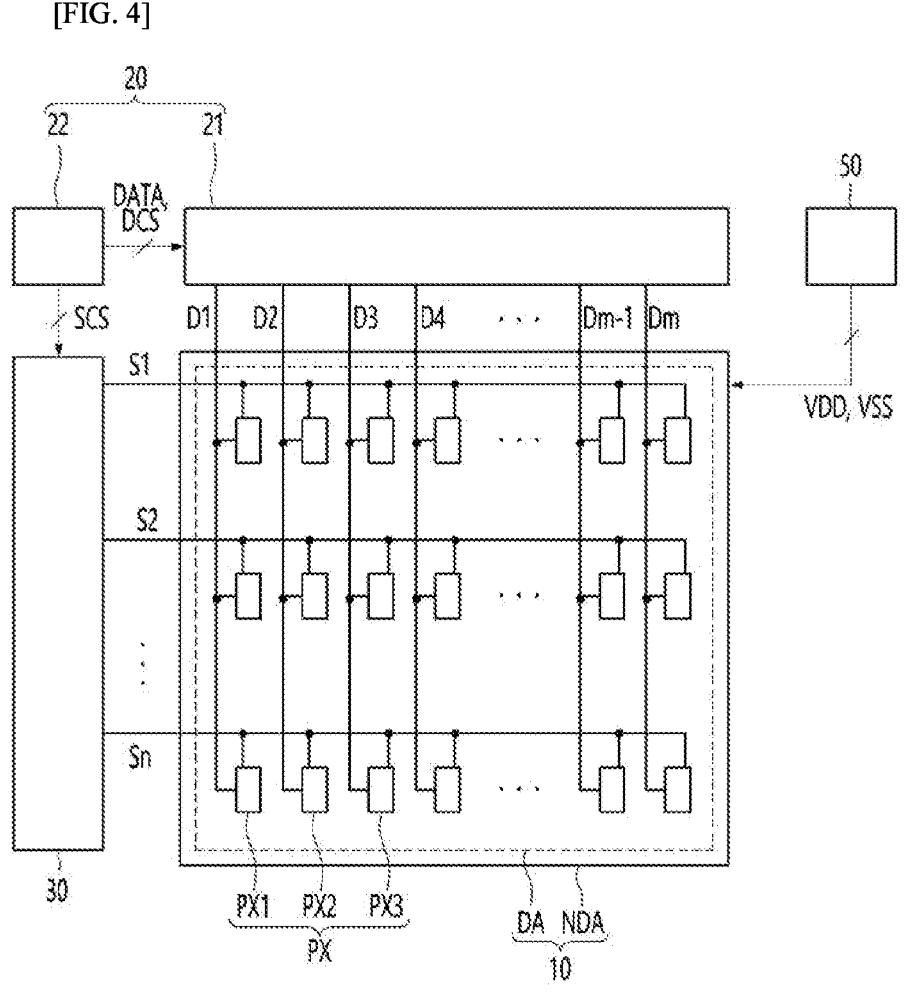

[FIG. 5]
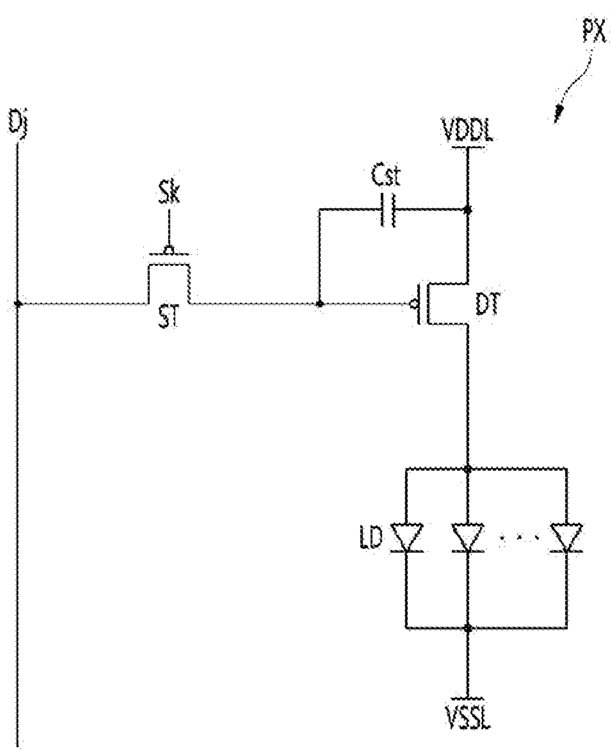

[FIG. 6]
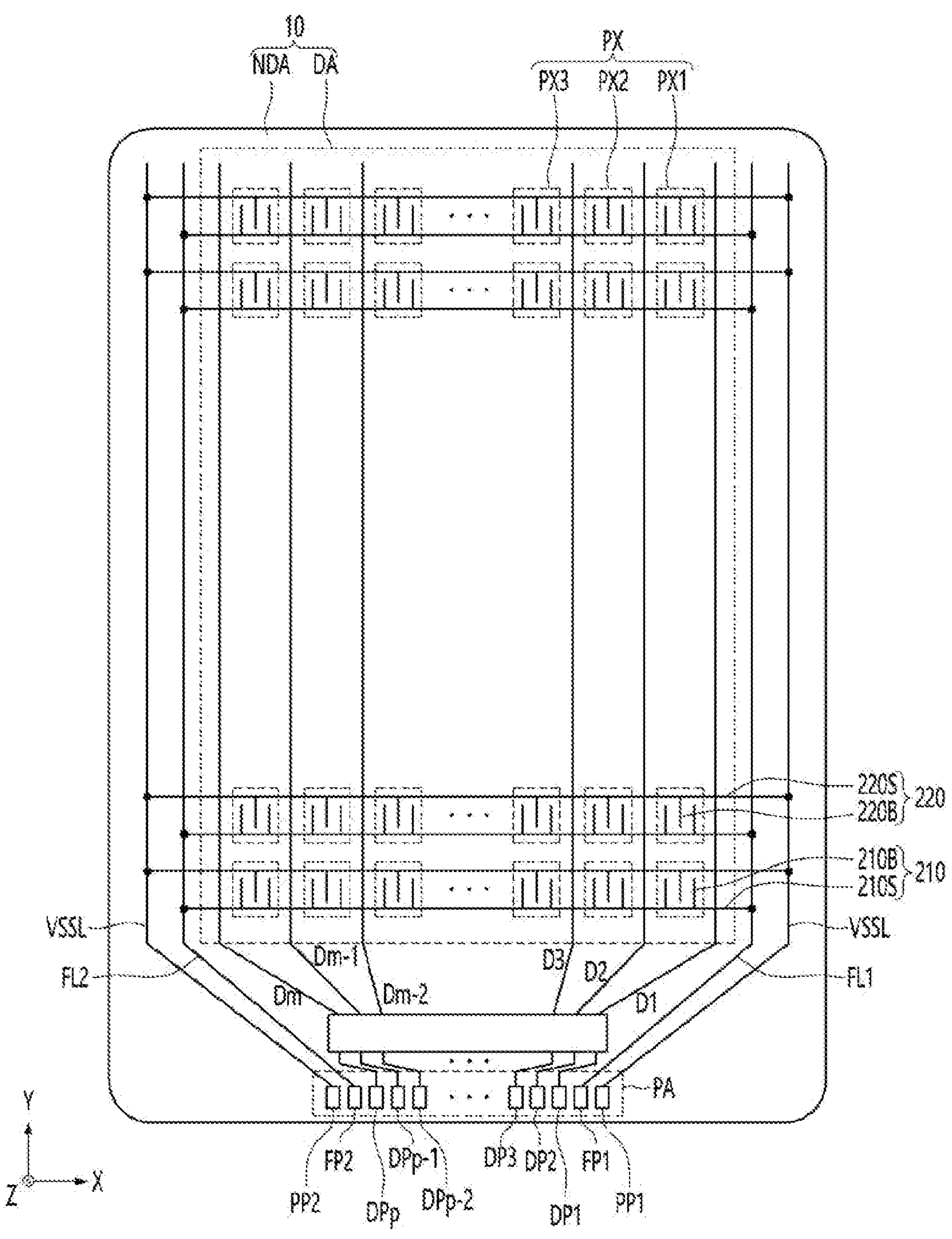

[FIG. 7]
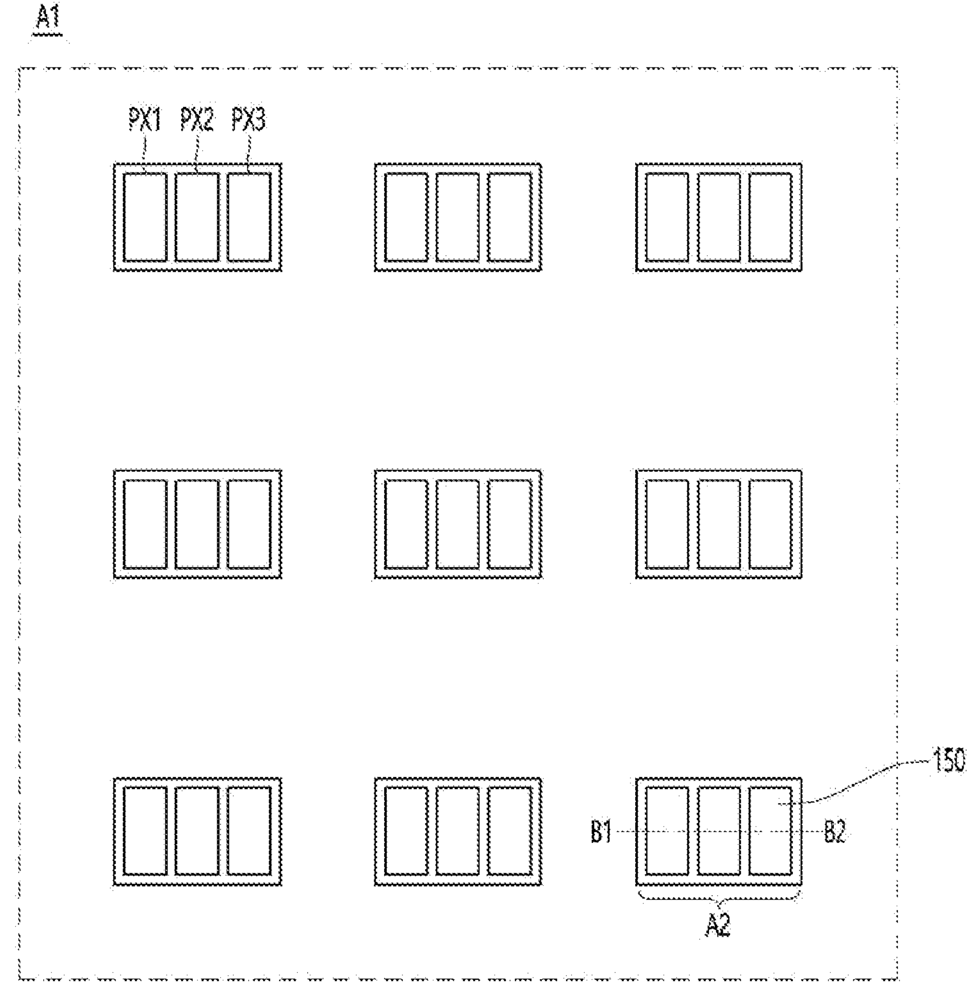

[FIG. 8]
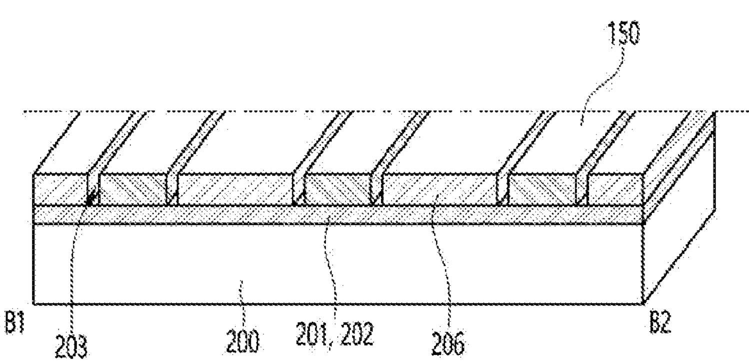
[FIG. 9]
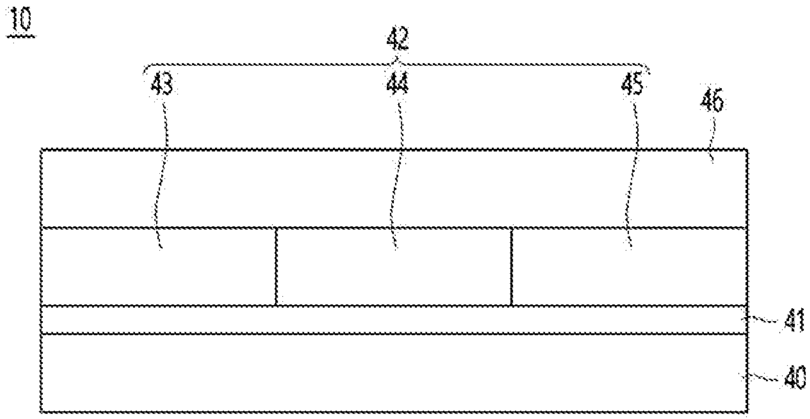

[FIG. 10]
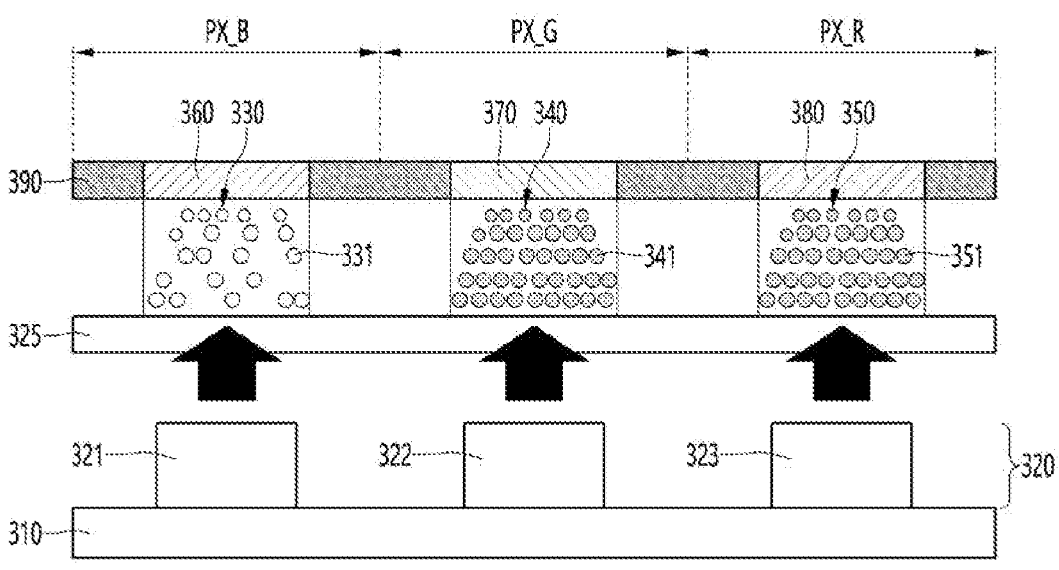
[FIG. 11]
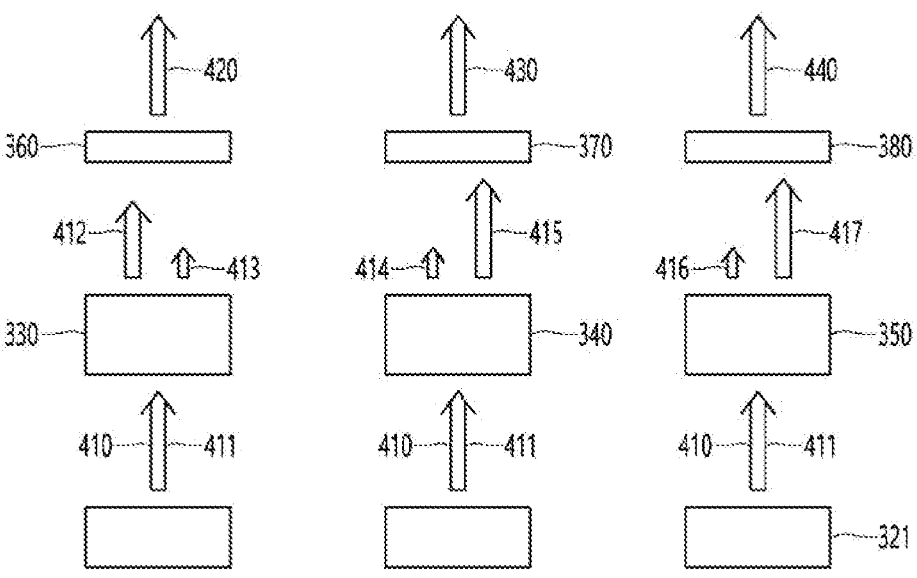

[FIG. 12]
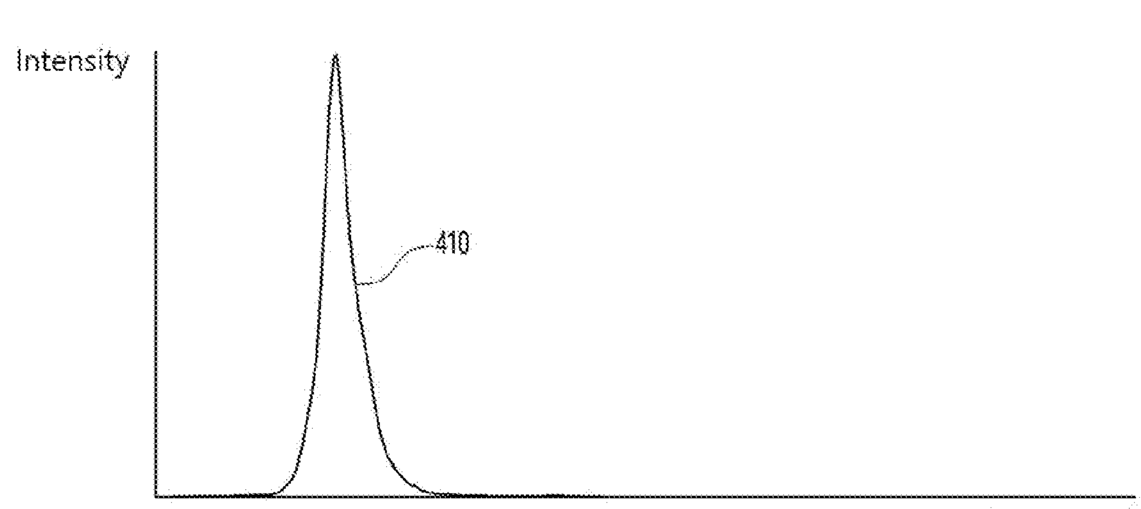
[FIG. 13]
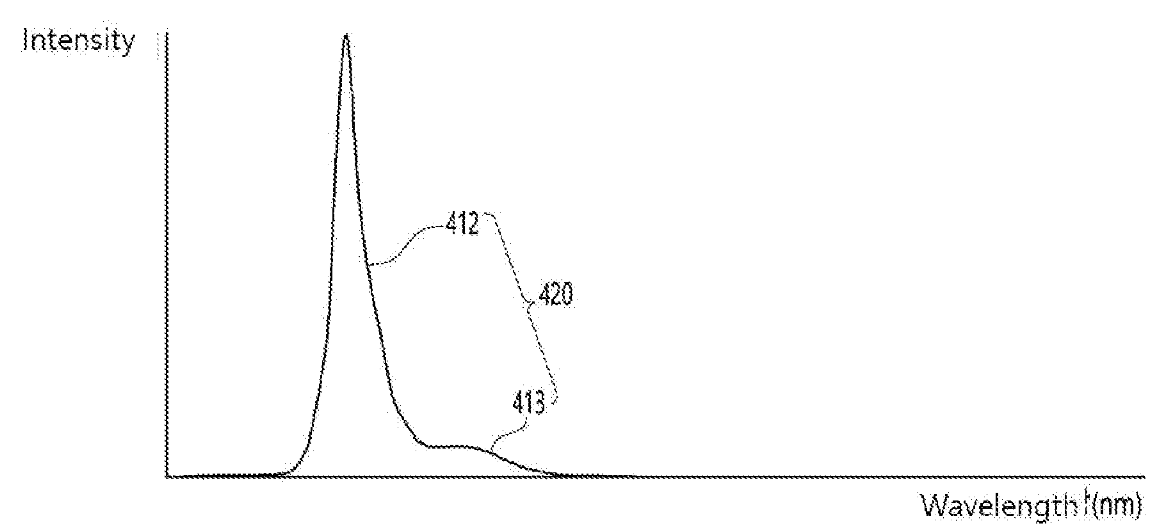

[FIG. 14]

Intensity
412
420
413
Wavelength (nm)

[FIG. 15]

452
453
0.6
0.5
0.4
V' 0.3
0.2
0.1
0
BT.2020
Embodi
ment
451
0 0.1 0.2 0.3 0.4 0.5 0.6
Prior art
U'

[FIG. 16]
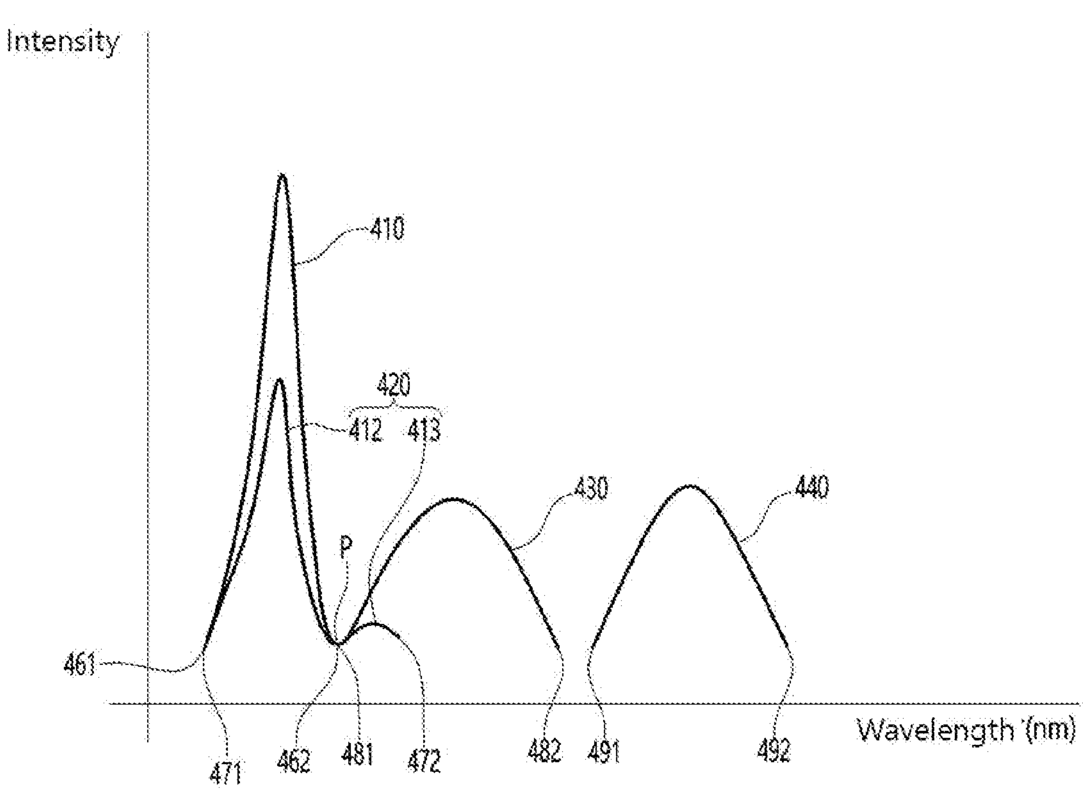
[FIG. 17]
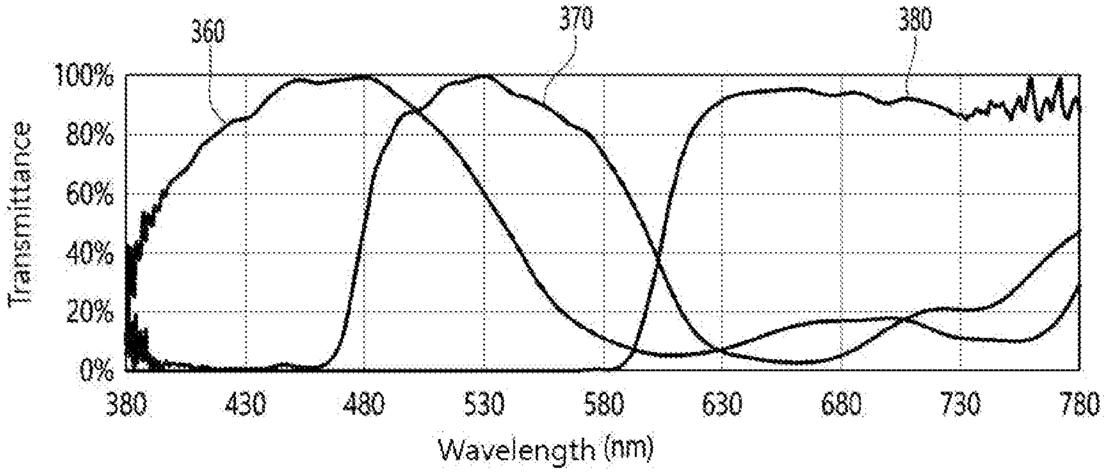

DISPLAY DEVICE

CROSS REFERENCE TO RELATED APPLICATIONS

This application is the National Phase of PCT International Application No. PCT/KR2021/007676, filed on Jun. 18, 2021, all of which is hereby expressly incorporated by reference into the present application.

TECHNICAL FIELD

The embodiment relates to a display device.

BACKGROUND ART

Display devices display high-definition images using self-luminous devices such as light emitting diodes as light sources for pixels. Light emitting diodes exhibit excellent durability even under harsh environmental conditions and are capable of long lifespan and high brightness, so they are attracting attention as a light source for next-generation display devices.

Recently, research is being conducted to manufacture light emitting devices using highly reliable semiconductor materials and place them on panels of display devices (hereinafter referred to as "display panels") to use them as next-generation pixel light sources. In other words, in order to implement high resolution, the size of the pixel is gradually becoming smaller, and since light emitting devices must be aligned in pixels of such a small size, research on the manufacture of ultra-small light emitting devices as small as micro or nanoscale is being actively conducted.

Meanwhile, in the case of a display panel using a light emitting diode as a light source, a color conversion layer is provided to convert the short-wavelength light generated by the light source into a longer wavelength to implement a color image. For example, the color conversion layer includes a green conversion layer disposed in a green pixel to convert light generated from a light source into green light, and a blue conversion layer disposed in a red pixel to convert light generated from a light source into blue light.

Typically, the smaller the wavelength of light generated from a light source, the greater the excitation efficiency of the color conversion layer.

As shown in FIG. 1, it can be seen that the excitation spectrum becomes larger as the wavelength becomes smaller. Therefore, as the wavelength of light generated from the light source becomes smaller, the excitation efficiency increases, thereby increasing the amount of desired color light in the color conversion layer.

Accordingly, light emitting diodes that generate blue light or ultraviolet light have been conventionally used as light sources.

Meanwhile, in order to produce image close to natural colors, the color reproduction rate must be high, and for this purpose, various standards have been established. In order to obtain color reproduction rates that meet various standards, red light, green light, and blue light must be located at each color vertex of the triangle of the corresponding standard.

However, when conventional short-wavelength light is used, there is a problem in that the desired color reproduction rate cannot be obtained because the dominant wavelength of the light deviates from the standard triangle.

That is, as shown in FIG. 2, a triangle is formed by the blue vertex (1), green vertex (3), and red vertex (5) according to the BT.2020 standard. In this case, the dominant wavelength of the conventional light source is located away from the blue vertex (1) outside the triangle of the BT.2020 standard. In this case, there is a problem that color reproduction of the color around the blue vertex (1) of the BT.2020 standard cannot be performed. That is, preferably, the dominant wavelength of the conventional light source should be located at the blue vertex (1) of the BT.2020 standard.

However, in order to increase the excitation efficiency in the color conversion layer, a light source with a shorter wavelength was used, and accordingly, the dominant wavelength of the light source was spaced further away from the blue vertex (1) of the Bt.2020 standard, there is a problem that the color reproduction rate deteriorates further.

DISCLOSURE

Technical Problem

The embodiment aims to solve the above-mentioned problems and other problems.

Another purpose of the embodiment is to provide a display device capable of improving color reproduction rate.

Another purpose of the embodiment is to provide a display device that complies with color reproduction rate standards.

The technical problems of the embodiments are not limited to those described in this item and include those that can be understood through the description of the invention.

Technical Solution

According to an embodiment to achieve the above or other purposes, a display device for displaying a color image with a color gamut standard defined by a triangle connecting a first color vertex, a second color vertex, and a third color vertex includes a substrate; a light source disposed on the substrate and generating first light of a first dominant wavelength corresponding to a first color coordinate located outside the triangle and spaced apart from the first color vertex; a conversion layer disposed on the substrate to convert the first light into a plurality of lights having different dominant wavelengths; and a color filter layer disposed on the conversion layer, the light source comprises a plurality of semiconductor light emitting devices disposed on a plurality of color areas of the substrate, the conversion layer includes a first conversion layer disposed on at least one first color area among the plurality of color areas of the substrate to convert the first light into a second light of a second dominant wavelength corresponding to the second color coordinate of the first color vertex and output the first light and the second light; a second conversion layer disposed on at least one second color area among the plurality of color areas of the substrate to convert the first light into a third light of a third dominant wavelength corresponding to the third color coordinate of the second color vertex and output the first light and the third light; and a second conversion layer disposed on at least one third color area among the plurality of color areas of the substrate to convert the first light into a fourth light of a fourth dominant wavelength corresponding to the fourth color coordinate of the third color vertex and output the first light and the fourth light; wherein the first conversion layer and the second conversion layer include the same material.

The first light may be blue light, and each of the second and third lights may be a mixed light of blue light and green light.

The first conversion layer and the second conversion layer may include green phosphor.

The first conversion layer and the second conversion layer may include green quantum dots.

The color filter layer may include a first color filter disposed on the first conversion layer to output the second light; a second color filter disposed on the second conversion layer to output the third light; and a third color filter disposed on the third conversion layer and outputting the fourth light.

The semiconductor light emitting device may include one of a micrometer-level semiconductor light emitting device and a nanometer-level semiconductor light emitting device.

Advantageous Effects

The embodiment provides a display device capable of displaying a color image by red light, green light, and blue light.

Conventionally, short-wavelength light was used as a light source to improve excitation efficiency. However, the excitation efficiency of the light source was increased, and the green conversion efficiency and red conversion efficiency were improved. Conventionally, short-wavelength light was used to create a color image together with the converted green light and the converted red light. In this case, since the short-wavelength light is located outside the triangle of the BT.2020 standard, for example, as shown in FIG. 1, there is a problem of lowering the color reproduction rate.

According to the embodiment, as shown in FIGS. 10 and 11, short-wavelength light that is, the first dominant wavelength of the first length 410 is converted to a second dominant wavelength, as shown in FIG. 15, the color reproduction rate can be improved compared to the prior art by ensuring that the second light 420 of the second dominant wavelength is located at the first color vertex 451 of the triangle of the BT.2020 standard (see Table 3).

According to an embodiment, the first conversion layer 330 may be provided to convert the first dominant wavelength of the first light 410 into the first dominant wavelength. The first conversion layer 330 and the second conversion layer 340 may include a green conversion material. Green conversion materials may include green phosphors or green quantum dots.

The density of the green conversion material of the first conversion layer 330 may be lower than the density of the green conversion material of the second conversion layer 340. The first conversion layer 330 and the second conversion layer 340 may include blue light 412 and 414 and green light 413 and 415. Accordingly, the density of the green conversion material of the first conversion layer 330 is made low, so that only a very small amount of blue light 411 is converted into green light 413 in the first conversion layer 330, and most of the rest is converted to green light 413. Therefore, the second dominant wavelength of the second light 420 is made larger than the first dominant wavelength of the first light 410 by the green conversion material included in the first conversion layer 330, so that the second dominant wavelength of the second light 420 is located at the first color vertex 451 of the triangle of the BT.2020 standard. As a result, the color reproduction rate can be improved compared to before.

By adjusting the density of the green conversion material included in the first conversion layer 330, the second dominant wavelength of the second light 420 is located at the first color vertex of various other standards in addition to the BT.2020 standard. This allows it to meet various color reproduction rate standards.

Additional scope of applicability of the embodiments will become apparent from the detailed description below. However, since various changes and modifications within the spirit and scope of the embodiments may be clearly understood by those skilled in the art, the detailed description and specific embodiments, such as preferred embodiments, should be understood as being given by way of example only.

DESCRIPTION OF DRAWINGS

FIG. 1 shows the excitation spectrum and optical emission spectrum as a function of wavelength.

FIG. 2 shows the location of the dominant wavelength of light that deviates from the conventional color reproduction rate standard.

FIG. 3 shows the living room of a house where the display device 100 according to an embodiment is placed.

FIG. 4 is a block diagram schematically showing a display device according to an embodiment.

FIG. 5 is a circuit diagram showing an example of the pixel of FIG. 4.

FIG. 6 is a plan view showing the display panel of FIG. 4 in detail.

FIG. 7 is an enlarged view of the first panel area in the display device of FIG. 3.

FIG. 8 is an enlarged view of area A2 in FIG. 7.

FIG. 9 is a cross-sectional view schematically showing the display panel of FIG. 4.

FIG. 10 is a cross-sectional view showing a display device according to an embodiment.

FIG. 11 shows light output from each of the light source, conversion layer, and color filter.

FIG. 12 shows the first light emitted from the semiconductor light emitting device.

FIG. 13 shows second light output from the first conversion layer and the first color filter layer according to the first embodiment.

FIG. 14 shows second light output from the first conversion layer and the first color filter layer according to the second embodiment.

FIG. 15 shows the position of the dominant wavelength of light in the prior art and the embodiment.

FIG. 16 shows distribution according to the wavelength of first to fourth lights according to an embodiment.

FIG. 17 shows a transmission section according to the wavelength of a color filter according to an embodiment.

MODE FOR INVENTION

Hereinafter, embodiments disclosed in the present specification will be described in detail with reference to the attached drawings, but identical or similar components will be assigned the same reference numbers regardless of the reference numerals, and duplicate descriptions thereof will be omitted. The suffixes ‘module’ and ‘part’ for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes either directly on the other element or there may be other intermediate elements in between.

Display devices described in this specification may include mobile phones, smart phones, laptop computers, digital broadcasting terminals, PDA (personal digital assistants), PMPs (portable multimedia players), navigation, slates PC, tablet PC, ultra-books, digital TV, desktop computers, etc. However, the configuration according to the embodiment described in this specification may be applied to a device capable of displaying even if it is a new product type that is developed in the future.

Hereinafter, a light emitting device according to an embodiment and a display device including the same will be described.

FIG. 3 shows a living room of a house where a display device according to an embodiment is placed.

The display device 100 of the embodiment may display the status of various electronic products such as a washing machine 101, a robot vacuum cleaner 102, and an air purifier 103, and can communicate with each electronic product based on IoT. It is also possible to control each electronic product based on the user's setting data.

The display device 100 according to the embodiment may include a flexible display manufactured on a thin and flexible substrate. Flexible displays may bend or curl like paper while maintaining the characteristics of existing flat displays.

In a flexible display, visual information may be implemented by independently controlling the light emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

FIG. 4 is a block diagram schematically showing a display device according to an embodiment, and FIG. 5 is a circuit diagram showing an example of the pixel of FIG. 4.

Referring to FIGS. 4 and 5, a display device according to an embodiment may include a display panel 10, a driving circuit 20, a scan driver 30, and a power supply circuit 50.

The display device 100 of the embodiment may drive the light emitting device in an active matrix (AM, Active Matrix) method or a passive matrix (PM, Passive Matrix) method.

The driving circuit 20 may include a data driver 21 and a timing control unit 22.

The display panel 10 may be rectangular, but this is not limited. That is, the display panel 10 may be formed in a circular or oval shape. At least one side of the display panel 10 may be bent to a predetermined curvature.

The display panel 10 may be divided into a display area DA and a non-display area NDA disposed around the display area DA. The display area DA is an area where pixels PX are formed to display an image. The display panel 10 may include a data lines (D1 to Dm, m is an integer greater than 2), a scan lines (S1 to Sn, n is an integer greater than 2) that intersect the data lines (D1 to Dm), a high potential voltage line supplied with a high potential voltage, a low potential voltage line supplied with a low potential voltage, and a pixel PX connected to data lines (D1 to Dm) and scan lines (S1 to Sn).

Each of the pixels PX may include a first sub-pixel PX1, a second sub-pixel PX2, and a third sub-pixel PX3. The first sub-pixel PX1 may emit a first color light of a first dominant wavelength, the second sub-pixel PX2 may emit a second color light of a second dominant wavelength, and the third sub-pixel PX3 may emit a third color light of a third dominant wavelength. The first color light may be red light, the second color light may be green light, and the third color light may be blue light, but are not limited thereto. Additionally, in FIG. 4, it is illustrated that each pixel PX includes three sub-pixels, but the present invention is not limited thereto. That is, each pixel PX may include four or more sub-pixels.

Each of the first sub-pixel PX1, the second sub-pixel PX2, and the third sub-pixel PX3 may be connected to at least one of the data lines (D1 to Dm), at least one of the scan lines (S1 to Sn), and a high potential voltage line. As shown in FIG. 5, the first sub-pixel PX1 may include light emitting devices LD, a plurality of transistors for supplying current to the light emitting devices LD, and at least one capacitor Cst.

Although not shown in the drawing, each of the first sub-pixel PX1, the second sub-pixel PX2, and the third sub-pixel PX3 may include only one light emitting device LD and at least one capacitor Cst.

Each of the light emitting devices LD may be a semiconductor light emitting diode including a first electrode, a plurality of conductive semiconductor layers, and a second electrode. Here, the first electrode may be an anode electrode and the second electrode may be a cathode electrode, but this is not limited.

The plurality of transistors may include a driving transistor DT that supplies current to the light emitting devices LD, and a scan transistor ST that supplies a data voltage to the gate electrode of the driving transistor DT, as shown in FIG. 5. The driving transistor DT may include a gate electrode connected to the source electrode of the scan transistor ST, a source electrode connected to a high potential voltage line to which a high potential voltage is applied and a drain electrode connected to the first electrodes of the light emitting devices LD. The scan transistor ST may include a gate electrode connected to the scan line (Sk, k is an integer satisfying $1 \leq k \leq n$), a source electrode connected to the gate electrode of the driving transistor DT, and a drain electrode connected to the data line (Dj, j is an integer satisfying $1 \leq j \leq m$).

The capacitor Cst may be formed between the gate electrode and the source electrode of the driving transistor DT. The storage capacitor Cst charges the difference between the gate voltage and source voltage of the driving transistor DT.

The driving transistor DT and the scan transistor ST may be formed of a thin film transistor. In addition, in FIG. 5, the driving transistor DT and the scan transistor ST are mainly described as being formed of a P-type MOSFET (Metal Oxide Semiconductor Field Effect Transistor), but the present invention is not limited thereto. The driving transistor DT and scan transistor ST may be formed of an N-type MOSFET. In this case, the positions of the source and drain electrodes of each of the driving transistor (DT) and scan transistor (ST) may be changed.

In addition, in FIG. 5, the first sub-pixel PX1, the second sub-pixel PX2, and the third sub-pixel PX3 each include 2TIC (2 Transistor-1 capacitor) with one driving transistor DT, one scan transistor ST and one capacitor Cst, the present invention is not limited thereto. Each of the first sub-pixel PX1, the second sub-pixel PX2, and the third sub-pixel PX3 may include a plurality of scan transistors ST and a plurality of capacitors Cst.

Since the second sub-pixel PX2 and the third sub-pixel PX3 may be represented by substantially the same circuit diagram as the first sub-pixel PX1, detailed descriptions thereof will be omitted.

The driving circuit 20 outputs signals and voltages for driving the display panel 10. For this purpose, the driving circuit 20 may include a data driver 21 and a timing controller 22.

The data driver 21 receives digital video data DATA and source control signal DCS from the timing control unit 22. The data driver 21 converts digital video data DATA into analog data voltages according to the source control signal DCS and supplies them to the data lines (D1 to Dm) of the display panel 10.

The timing control unit 22 receives digital video data DATA and timing signals from the host system. Timing signals may include a vertical sync signal, a horizontal sync signal, a data enable signal, and a dot clock. The host system may be an application processor in a smartphone or tablet PC, a monitor, or a system-on-chip in a TV.

The timing control unit 22 generates control signals to control the operation timing of the data driver 21 and the scan driver 30. The control signals may include a source control signal DCS for controlling the operation timing of the data driver 21 and a scan control signal SCS for controlling the operation timing of the scan driver 30.

The driving circuit 20 may be disposed in the non-display area NDA provided on one side of the display panel 10. The driving circuit 20 may be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 may be mounted on a circuit board (not shown) rather than on the display panel 10.

The data driver 21 may be mounted on the display panel 10 using a COG (chip on glass) method, a COP (chip on plastic) method, or an ultrasonic bonding method, and the timing control unit 22 may be mounted on a circuit board.

The scan driver 30 receives a scan control signal SCS from the timing control unit 22. The scan driver 30 generates scan signals according to the scan control signal SCS and supplies them to the scan lines (S1 to Sn) of the display panel 10. The scan driver 30 may include a plurality of transistors and may be formed in the non-display area NDA of the display panel 10. Alternatively, the scan driver 30 may be formed as an integrated circuit, and in this case, the scan deriver 30 may be mounted on a gate flexible film attached to the other side of the display panel 10.

The circuit board may be attached to pads provided at one edge of the display panel 10 using an anisotropic conductive film. Because of this, the lead lines of the circuit board may be electrically connected to the pads. The circuit board may be a flexible printed circuit board, a printed circuit board, or a flexible film such as a chip on film. The circuit board may be bent toward the bottom of the display panel 10. Because of this, one side of the circuit board may be attached to one edge of the display panel 10, and the other side is placed below the display panel 10 and may be connected to a system board on which the host system is mounted.

The power supply circuit 50 may generate voltages necessary for driving the display panel 10 from the main power supplied from the system board and supply them to the display panel 10. For example, the power supply circuit 50 generates a high potential voltage VDD and a low potential voltage VSS for driving the light emitting devices LD of the display panel 10 from the main power supply, so that it can be supplied to the high potential voltage line and the low potential voltage line of the display panel 10. Additionally, the power supply circuit 50 may generate and supply driving voltages for driving the driving circuit 20 and the scan driver 30 from the main power supply.

FIG. 6 is a plan view showing the display panel of FIG. 4 in detail. In FIG. 6, for convenience of explanation, data pads (DP1 to DPp, p is an integer of 2 or more), floating pads FP1, FP2, power pads PP1, PP2, and floating lines FL1, FL2, low potential voltage line VSSL, data lines D1 to Dm, first pad electrodes 210, and second pad electrodes 220 are only shown.

Referring to FIG. 6, data lines D1 to Dm, first pad electrodes 210, second pad electrodes 220, and pixels PX may be disposed in the display area DA of the display panel 10.

The data lines D1 to Dm may extend long in the second direction (Y-axis direction). One side of the data lines D1 to Dm may be connected to the driving circuit (20 in FIG. 4). Because of this, the data voltages of the driving circuit 20 may be applied to the data lines D1 to Dm.

The first pad electrodes 210 may be arranged to be spaced apart at predetermined intervals in the first direction (X-axis direction). Because of this, the first pad electrodes 210 may not overlap the data lines D1 to Dm. Among the first pad electrodes 210, the first pad electrodes 210 disposed at the right edge of the display area DA may be connected to the first floating line FL1 in the non-display area NDA. Among the first pad electrodes 210, the first pad electrodes 210 disposed at the left edge of the display area DA may be connected to the second floating line FL2 in the non-display area NDA.

Each of the second pad electrodes 220 may extend long in the first direction (X-axis direction). Because of this, the second pad electrodes 220 may overlap the data lines D1 to Dm. Additionally, the second pad electrodes 220 may be connected to the low potential voltage line VSSL in the non-display area NDA. Because of this, the low potential voltage of the low potential voltage line VSSL may be applied to the second pad electrodes 220.

A pad portion PA, a driving circuit 20, a first floating line FL1, a second floating line FL2, and a low potential voltage line VSSL may be disposed in the non-display area NDA. The pad portion PA may include data pads DP1 to DPp, floating pads FP1 and FP2, and power pads PP1 and PP2.

The pad portion PA may be disposed at one edge of the display panel 10, for example, at the lower edge. The data pads DP1 to DPp, the floating pads FP1 and FP2, and the power pads PP1 and PP2 may be arranged side by side in the first direction (X-axis direction) in the pad portion PA.

A circuit board may be attached to the data pads DP1 to DPp, floating pads FP1, FP2, and power pads PP1, PP2 using an anisotropic conductive film. Because of this, the circuit board and the data pads DP1 to DPp, floating pads FP1 and FP2, and power pads PP1 and PP2 may be electrically connected.

The driving circuit 20 may be connected to the data pads DP1 to DPp through link lines. The driving circuit 20 may receive digital video data DATA and timing signals through the data pads DP1 to DPp. The driving circuit 20 may convert digital video data DATA into analog data voltages and supply them to the data lines D1 to Dm of the display panel 10.

The low potential voltage line VSSL may be connected to the first power pad PP1 and the second power pad PP2 of the pad portion PA. The low potential voltage line VSSL may extend long in the second direction (Y-axis direction) from the non-display area NDA outside the left and right sides of the display area DA. The low potential voltage line VSSL may be connected to the second pad electrode 220. Because of this, the low potential voltage of the power supply circuit 50 may be applied to the second pad electrode 220 through the circuit board, the first power pad PP1, the second power pad PP2, and the low potential voltage line VSSL.

The first floating line FL1 may be connected to the first floating pad FP1 of the pad portion PA. The first floating line FL1 may extend long in the second direction (Y-axis direction) from the non-display area NDA outside the left and right sides of the display area DA. The first floating pad FP1 and the first floating line FL1 may be dummy pads and dummy lines to which no voltage is applied.

The second floating line FL2 may be connected to the second floating pad FP2 of the pad portion PA. The first floating line FL1 may extend long in the second direction (Y-axis direction) from the non-display area NDA outside the left and right sides of the display area DA. The second floating pad FP2 and the second floating line FL2 may be dummy pads and dummy lines to which no voltage is applied.

Meanwhile, since the light emitting devices (LD in FIG. 5) have a very small size, it is very difficult to install the pixels PX in each of the first sub-pixel PX1, second sub-pixel PX2, and third sub-pixel PX3.

To solve this problem, an alignment method using dielectrophoresis was proposed.

Figure 14:
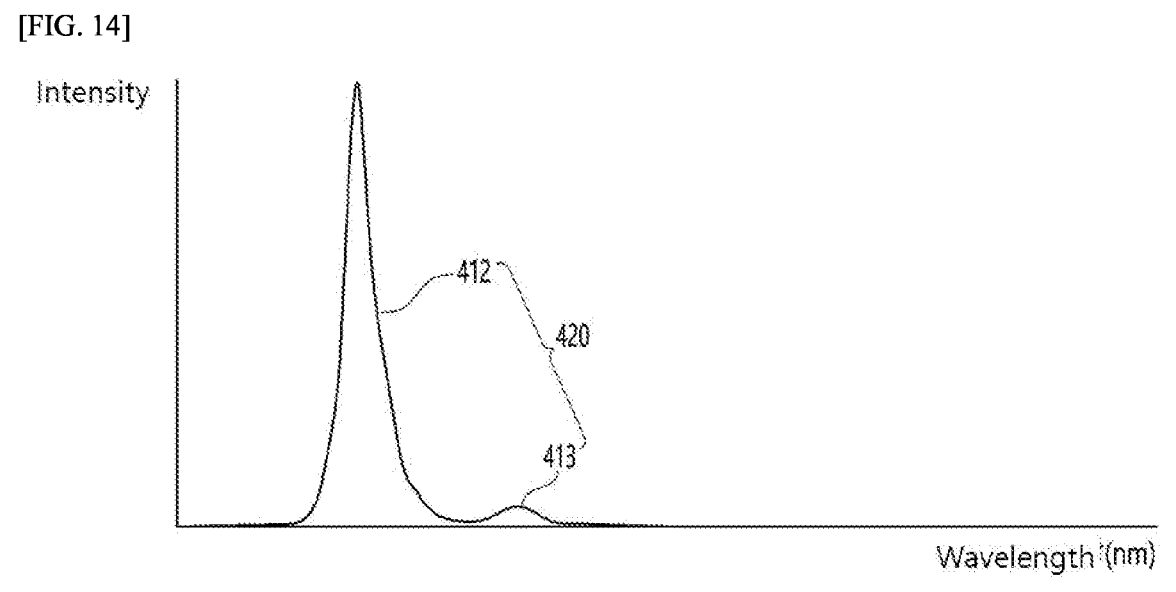

That is, in order to align the light emitting devices (310, 320, and 330 in FIG. 14) during the manufacturing process of the display panel 10, an electric filed may be formed in the first sub-pixel PX1 and the second sub-pixel PX2 and the third sub-pixel PX3 of each of the pixels PX. Specifically, during the manufacturing process, the light emitting devices 310, 320 and 330 may be aligned in each of the first sub-pixel PX1, the second sub-pixel PX2 and the third sub-pixel PX3 by applying a dielectrophoretic force to the light emitting devices using a dielectrophoretic method.

However, during the manufacturing process, it is difficult to drive the thin film transistors and apply a ground voltage to the first pad electrodes 210.

Therefore, in the completed display device, the first pad electrodes 210 are arranged to be spaced apart at predetermined intervals in the first direction (X-axis direction), but during the manufacturing process, the first pad electrodes 210 may not be disconnected in the first direction (X-axis direction) but may be arranged to extend long.

For this reason, the first pad electrodes 210 may be connected to the first floating line FL1 and the second floating line FL2 during the manufacturing process. Therefore, the first pad electrodes 210 may receive the ground voltage through the first floating line FL1 and the second floating line FL2. Therefore, after aligning the light emitting devices 310, 320, and 330 using a dielectrophoresis method during the manufacturing process, the first pad electrodes 210 are disconnected, so that the first pad electrodes 210 may be arranged to be spaced apart at predetermined intervals in the first direction (X-axis direction).

Meanwhile, the first floating line FL1 and the second floating line FL2 are lines for applying ground voltage during the manufacturing process, and no voltage may be applied in the completed display device. Alternatively, in the completed display device, a ground voltage may be applied to the first floating line FL1 and the second floating line FL2 to prevent static electricity or to drive the light emitting devices 310, 320, and 330.

FIG. 7 is an enlarged view of the first panel area in the display device of FIG. 3.

According to FIG. 7, the display device 100 of the embodiment may be manufactured by mechanically and electrically connecting a plurality of panel areas, such as the first panel area A1, by tiling.

The first panel area A1 may include a plurality of light emitting devices 150 arranged for each unit pixel (PX in FIG. 4).

For example, the unit pixel PX may include a first sub-pixel PX1, a second sub-pixel PX2, and a third sub-pixel PX3. For example, the first sub-pixel PX1 may output red light, the second sub-pixel PX2 may output green light, and the third sub-pixel PX3 may output blue light. The unit pixel PX may further include a fourth sub-pixel in which no light emitting device is disposed, but this is not limited.

FIG. 8 is an enlarged view of area A2 in FIG. 7.

Referring to FIG. 8, the display device 100 of the embodiment may include a substrate 200, a wiring electrodes 201 and 202, an insulating layer 206, and a plurality of light emitting devices 150. More components may be included than this.

The wiring electrode may include a first wiring electrode 201 and a second wiring electrode 202 that are spaced apart from each other. The first wire electrode 201 and the second wire electrode 202 may be provided to generate dielectrophoretic force to assemble the light emitting device 150. The first wiring electrode 201 and the second wiring electrode 202 generate dielectrophoretic force so that the light emitting device 150 can be easily assembled.

The substrate 200 may be formed of glass or polyimide. Additionally, the substrate 200 may include a flexible material such as PEN (Polyethylene Naphthalate) or PET (Polyethylene Terephthalate). Additionally, the substrate 200 may be made of a transparent material, but is not limited thereto.

The insulating layer 206 may include an insulating and flexible material such as polyimide, PEN, PET, etc., and may be integrated with the substrate 200 to form one substrate.

The insulating layer 206 may be a conductive adhesive layer that has adhesiveness and conductivity, and the conductive adhesive layer may be flexible and enable a flexible function of the display device. For example, the insulating layer 206 may be an anisotropic conductive film (ACF) or a conductive adhesive layer such as an anisotropic conductive medium or a solution containing conductive particles. The conductive adhesive layer may be a layer that is electrically conductive in a direction perpendicular to the thickness, but electrically insulating in a direction horizontal to the thickness.

The insulating layer 206 may include an assembly hole 203 into which the light emitting device 150 is inserted. Therefore, during self-assembly, the light emitting device 150 can be easily inserted into the assembly hole 203 of the insulating layer 206. The assembly hole 203 may be called an insertion hole, a fixing hole, an alignment hole, etc.

Meanwhile, the display device according to the embodiment may display an image using a light emitting device. The light emitting device of the embodiment is a self-light emitting device that emits light by itself by applying electricity, and may be a semiconductor light emitting device. Since the light emitting device of the embodiment is made of an inorganic semiconductor material, it is resistant to deterioration and has a semi-permanent lifespan, providing stable light and contributing to the display device realizing high-quality and high-definition images.

For example, a display device may use a light emitting device as a light source and have a color generator on the light emitting device to display an image using the color generator.

Although not shown, the display device may display images through a display panel in which a plurality of light emitting elements that generate different color lights are arranged in pixels, respectively.

FIG. 9 is a cross-sectional view schematically showing the display panel of FIG. 4.

Referring to FIG. 9, the display panel 10 of the embodiment may include a first substrate 40, a light emitting unit 41, a color generating unit 42, and a second substrate 46. The display panel 10 of the embodiment may include more components than this, but is not limited thereto. The first substrate 40 may be the substrate 200 shown in FIG. 8.

Although not shown, at least one insulating layer may be disposed between the first substrate 40 and the light emitting unit 41, between the light emitting unit 41 and the color generating unit 42, and/or between the color generating unit 42 and the second substrate 46, but the present invention is not limited thereto.

The first substrate 40 may support the light emitting unit 41, the color generating unit 42, and the second substrate 46. The first substrate 40 may be provided various devices as described above, such as data lines (D1 to Dm, m is an integer of 2 or more), scan lines (S1 to Sn), high potential voltage line and low potential voltage line as shown in FIG. 4, a plurality of transistors ST, DT and at least one capacitor Cst as shown in FIG. 5, and a first pad electrode 210 and a second pad electrode as shown in FIG. 6.

The first substrate 40 may be formed of glass or a flexible material, but this is not limited.

The light emitting unit 41 may provide light to the color generating unit 42. The light emitting unit 41 may include a plurality of light sources that emit light by themselves by applying electricity. For example, the light source may include a light emitting device (150 in FIGS. 7 and 310, 320, and 330 in FIG. 14).

As an example, the plurality of light emitting devices 150 are arranged separately for each sub-pixel of the pixel and may emit light independently by controlling each sub-pixel.

As another example, the plurality of light emitting devices 150 may be arranged regardless of pixel division and emit light simultaneously from all sub-pixels.

The light emitting device 150 of the embodiment may emit blue light, but this is not limited. For example, the light emitting device 150 of the embodiment may emit white light or purple light.

Meanwhile, the light emitting device 150 may emit red light, green light, and blue light for each sub-pixel. For this purpose, for example, a red light emitting device that emits red light may be disposed in the first sub-pixel, that is, the red sub-pixel, a green light emitting device that emits green light may bes disposed in the second sub-pixel, that is, the green sub-pixel, a blue light emitting device that emits blue light may be disposed in the third sub-pixel, that is, the blue sub-pixel.

For example, the red light emitting device, the green light emitting device, and the blue light emitting device may each include a group II-IV compound or a group III-V compound, but there is no limitation thereto. For example, the group III-V compound may be a binary compound selected from the group consisting of GaN, GaP, GaAs, GaSb, 0, AIP, AlAs, AlSb, InN, InP, InAs, InSb, and mixtures thereof; a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof; and a tetraelement compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or mixtures thereof.

The color generating unit 42 may generate color light that is different from the light provided from the light emitting unit 41.

For example, the color generating unit 42 may include a first color generator 43, a second color generator 44, and a third color generator 45. The first color generator 43 may correspond to the first sub-pixel PX1 of the pixel, the second color generator 44 may correspond to the second sub-pixel PX2 of the pixel, and the third color generator 45 may correspond to the third sub-pixel PX3 of the pixel.

The first color generator 43 generates the first color light based on the light provided from the light emitting unit 41, the second color generator 44 generates the second color light based on the light provided from the light emitting unit 41 and the third color generator 45 generates the third color light based on the light provided from the light emitting unit 41. For example, the first color generator 43 may output the blue light of the light emitting unit 41 as red light, the second color generator 44 may output the blue light of the light emitting unit 41 as green light, and the third color generator 45 may output the blue light of the light emitting unit 41 as is.

As an example, the first color generator 43 may include a first color filter, the second color generator 44 may include a second color filter, and the third color generator 45 may include a third color filter.

The first color filter, the second color filter, and the third color filter may be formed of a transparent material that allows light to pass through.

For example, at least one of the first color filter, the second color filter, and the third color filter may include a quantum dot.

Quantum dots in examples may be selected from Group II-IV compounds, Group III-V compounds, Group IV-VI compounds, Group IV compounds, Group IV compounds, and combinations thereof.

Group II-VI compounds may be binary compounds selected from the group consisting of CdSe, CdTe, ZnS, ZnSe, ZnTe, ZnO, HgS, HgSe, HgTe, MgSe, MgS, and mixtures thereof; a ternary compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a tetraelement compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, or mixtures thereof.

Group III-V compounds may be binary compounds selected from the group consisting of GaN, GaP, GaAs, GaSb, AlN, AIP, AlAs, AlSb, InN, InP, InAs, InSb, and mixtures thereof; a ternary compounds selected from the group consisting of GaNP, GaNAs, GaNSb, GaPAs, GaPSb, AlInP, AlNP, AlNAs, AlNSb, AlPAS, AlPSb, InNP, InNAs, InNSb, InPAs, InPSb, GaAlNP, and mixtures thereof; and a tetraelement compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or mixtures thereof.

Group IV-VI compounds may be binary compounds selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe and mixtures thereof; and a tetraelement compound selected from the group consisting of SnPbSSe, SnPbSeTe, SnPbSTe, or mixtures thereof.

Group IV elements may be selected from the group consisting of Si, Ge, and mixtures thereof. The group IV compound may be a binary compound selected from the group consisting of SiC, SiGe, and mixtures thereof.

These quantum dots may have a full width of half maximum (FWHM) of the emission wavelength spectrum of approximately 45 nm or less, and light emitted through the quantum dots may be emitted in all directions. Accordingly, the viewing angle of the light emitting display device can be improved.

On the other hand, quantum dots may have the form of spherical, pyramidal, multi-arm, or cubic nanoparticles, nanotubes, nanowires, nanofibers, nanoplate-shaped particles, etc., but is not limited thereto.

For example, when the light emitting device 150 emits blue light, the first color filter may include red quantum dots, and the second color filter may include green quantum dots. The third color filter may not include quantum dots, but is not limited thereto. For example, blue light from the light emitting device 150 is absorbed by the first color filter, and the absorbed blue light is wavelength shifted by the red quantum dots to output red light. For example, blue light from the light emitting device 150 is absorbed by the second color filter, and the absorbed blue light is wavelength shifted by the green quantum dots to output green light. For example, blue light emitted from the device is absorbed by the third color filter, and this absorbed blue light may be emitted as is.

Meanwhile, when the light emitting device 150 emits white light, not only the first color filter and the second color filter but also the third color filter may include quantum dots. That is, the white light of the light emitting device 150 may be wavelength shifted to blue light by the quantum dots included in the third color filter.

For example, at least one of the first color filter, the second color filter, and the third color filter may include a phosphor. For example, some of the first color filters, second color filters, and third color filters may include quantum dots, and other color filters may include phosphors. For example, each of the first color filter and the second color filter may include a phosphor and a quantum dot. For example, at least one of the first color filter, the second color filter, and the third color filter may include scattering particles. Since the blue light incident on each of the first color filter, the second color filter, and the third color filter is scattered by the scattering particles and the scattered blue light is color shifted by the corresponding quantum dots, light output efficiency can be improved.

As another example, the first color generator 43 may include a first color conversion layer and a first color filter. The second color generator 44 may include a second color conversion layer and a second color filter. The third color generator 45 may include a third color conversion layer and a third color filter. Each of the first color conversion layer, the second color conversion layer, and the third color conversion layer may be disposed adjacent to the light emitting unit 41. The first color filter, second color filter, and third color filter may be disposed adjacent to the second substrate 46.

For example, the first color filter may be disposed between the first color conversion layer and the second substrate 46. For example, the second color filter may be disposed between the second color conversion layer and the second substrate 46. For example, the third color filter may be disposed between the third color conversion layer and the second substrate 46.

For example, the first color filter may be in contact with the top surface of the first color conversion layer and may have the same size as the first color conversion layer, but this is not limited. For example, the second color filter may be in contact with the top surface of the second color conversion layer and may have the same size as the second color conversion layer, but this is not limited. For example, the third color filter may be in contact with the top surface of the third color conversion layer and may have the same size as the third color conversion layer, but this is not limited.

For example, the first color conversion layer may include red quantum dots, and the second color conversion layer may include green quantum dots. The third color conversion layer may not include quantum dots. For example, the first color filter may include a red-based material that selectively transmits red light converted in the first color conversion layer, the second color filter may include a green-based material that selectively transmits green light converted in the second color conversion layer and the third color filter may include a blue-based material that selectively transmits blue light transmitted as is through the third color conversion layer.

Meanwhile, when the light emitting device 150 emits white light, not only the first color conversion layer and the second color conversion layer but also the third color conversion layer may include quantum dots. That is, the white light of the light emitting device 150 may be wavelength shifted to blue light by the quantum dots included in the third color filter.

Referring again to FIG. 9, the second substrate 46 is disposed on the color generating unit 42 to protect the color generating unit 42. The second substrate 46 may be formed of glass, but is not limited thereto.

The second substrate 46 may be called a cover window, cover glass, etc.

The second substrate 46 may be formed of glass or a flexible material, but is not limited thereto.

Meanwhile, the embodiment provides a display device capable of displaying a color image using red light, green light, and blue light.

Each of the plurality of pixels may include a first sub-pixel that outputs blue light, a second sub-pixel that outputs green light, and a third sub-pixel that outputs red light. For this purpose, for example, a semiconductor light emitting device that generates first light may be used as a light source. The first light may include ultraviolet light or blue light. The semiconductor light emitting device may be disposed in each of the first sub-pixel, the second sub-pixel, and the third sub-pixel, but this is not limited. In addition, a first conversion layer and a first color filter may be provided in the first sub-pixel to output second light using the first light generated by the semiconductor light emitting device. A second conversion layer and a second color filter may be provided in the second sub-pixel to output third light using the first light generated by the semiconductor light emitting device. A third conversion layer and a third color filter may be provided in the third sub-pixel to output fourth light using the first light generated by the semiconductor light emitting device. For example, the second light may include blue light, the third light may include green light, and the fourth light may include red light.

According to the embodiment, since the second light, third light, and fourth light meet the color reproduction rate standard, the color reproduction rate can be significantly improved. For example, the first light may have a first dominant wavelength located outside the triangle constructed according to the color reproduction rate standard. For example, the second light may have a second dominant wavelength corresponding to the color coordinates of the first color vertex of the corresponding triangle. For example, the third light may have a third dominant wavelength corresponding to the color coordinates of the second color vertex of the corresponding triangle. For example, the fourth light may have a fourth dominant wavelength corresponding to the color coordinate of the third color vertex of the corresponding triangle. The first color vertex may be a blue vertex, the second color vertex may be a green vertex, and the third color vertex may be a red vertex. In order to implement at least all the colors defined in the color reproduction rate standard, the dominant wavelength of the second light is located at or near the first color vertex, the dominant wavelength of the third light is located at or near the second color vertex, and the dominant wavelength of the fourth light is located at or near the second color vertex.

Here, the dominant wavelength may be defined as the point where a straight line passing through the color coordinates of the display device, that is, the white point and the color coordinates (x, y) of the object, meets the pure wavelength in the color system.

According to an embodiment, a semiconductor light emitting device that generates the first light of the first dominant wavelength located outside the triangle configured according to the color reproduction rate standard may be used as a light source. For example, the first dominant wavelength of the first light may be set in the range of 380 nm to 460 nm. However, the second dominant wavelength corresponding to the color coordinates of the first color vertex of the triangle configured according to the color reproduction rate standard may be set in the range of 460 nm to 480 nm. In this way, the first dominant wavelength of the first light may have a shorter wavelength than the first dominant wavelength. The reason why a semiconductor light emitting device that generates short-wavelength light is used as a light source is that the shorter the wavelength of light, the higher the excitation efficiency for the materials of the second conversion layer and the third conversion layer.

However, as the light generated from the light source has a shorter wavelength, when the light is output from the first sub-pixel, the dominant wavelength of the light, that is, blue light, is located further away from the first color vertex of the triangle in the color reproduction rate standard. Thus, even if green light is output from the second sub-pixel and red light is output from the third sub-pixel, the color reproduction rate may deteriorate because all colors defined in the color reproduction rate standard cannot be expressed due to blue light, green light, and red light.

In the embodiment, a first conversion layer is disposed in the first sub-pixel, and by converting the first light generated from the semiconductor light emitting device into the second light of a second dominant wavelength corresponding to the color coordinates of the first color vertex of the triangle of the color reproduction rate standard through the first conversion layer, the color reproduction rate can be improved to meet the color reproduction rate standard.

Below, various embodiments or modifications to improve color reproduction rate will be described in detail.

FIG. 10 is a cross-sectional view showing a display device according to an embodiment.

Referring to FIG. 10, a display device 300 according to an embodiment may include a substrate 310, a light source 320, conversion layers 330 to 350, and color filter layers 360 to 380. Although not shown, the display device 300 according to an embodiment may include more components than these. Descriptions omitted below may be replaced with descriptions related to FIGS. 8 and 9 or prior art.

Although not shown, at least one layer may be disposed between the substrate 310 and the light source 320 and/or between the light source 320 and the conversion layers 330 to 350. The layer may be an insulating layer, but is not limited thereto.

The substrate 310 may support the light source 320, the conversion layers 330 to 350, and the color filter layers 360 to 380. As described above, the substrate 310 may include various devices, such as data lines (D1 to Dm, m is an integer of 2 or more), scan lines S1 to Sn, high potential voltage lines, low potential voltage lines, a plurality of transistors ST, DT, at least one capacitor Cst as shown in FIG. 5, and a first pad electrode 210 and a second pad electrode 220 as shown in FIG. 6.

As shown in FIG. 11, the light source 320 may provide the first light 410 to the conversion layers 330 to 350. The light source 320 may include a plurality of semiconductor light emitting devices 321 that spontaneously emit first light 410 by electrical signals. The semiconductor light emitting device 321 of the embodiment may be the semiconductor light emitting device 150 shown in FIG. 7. As shown in FIG. 12, the first light 410 may have a dominant wavelength of, for example, 460 nm or less. For example, the semiconductor light emitting device 321 may be a micrometer-level semiconductor light emitting device or a nanometer-level semiconductor light emitting device depending on its size. For example, the semiconductor light emitting device 321 may be a horizontal semiconductor light emitting device, a flip type semiconductor light emitting device, or a vertical semiconductor light emitting device depending on the arrangement of the electrodes. For example, the semiconductor light emitting device 321 may be square or circular depending on its shape. For example, the semiconductor light emitting device 321 may have a plate shape.

A plurality of unit pixels may be defined on the substrate 310. A unit pixel may include multiple color areas. For example, a unit pixel may include a first color area, a second color area, and a third color area. For example, the first color area may be the blue sub-pixel PX_B, the second color area may be the green sub-pixel PX_G, and the third color area may be the blue sub-pixel PX_R.

Each of the plurality of semiconductor light emitting devices 321, 322, and 323 may be disposed in each sub-pixel PX_B, PX_G, and PX_R. For example, a plurality of semiconductor light emitting devices 321, 322, and 323 disposed in each sub-pixel PX_B, PX_G, and PX_R may emit light of the same color. For example, each of the plurality of semiconductor light emitting devices 321, 322, and 323 disposed in each sub-pixel PX_B, PX_G, and PX_R may emit blue light 411.

For example, a plurality of semiconductor light emitting devices 321, 322, and 323 disposed in each sub-pixel PX_B, PX_G, and PX_R may emit blue light 411 simultaneously. For example, a plurality of semiconductor light emitting devices 321, 322, and 323 disposed in each sub-pixel PX_B, PX_G, and PX_R may emit blue light 411 in scanning units. The scanning unit may refer to each of the scan lines S1 to Sn shown in FIG. 4. For example, the scan control signal SCS is supplied to the first scan line S1, so that each sub-pixel PX_B, PX_G, and PX_R connected to the first scan line S1 may be selected. For example, when each sub-pixel PX_B, PX_G and PX_R connected to the first scan line S1 is selected by the scan control signal SCS, the semiconductor light emitting devices 321, 322, and 323 disposed in each sub-pixel PX_B, PX_G, and PX_R connected to the first scan line S1 may simultaneously emit blue light 411.

Figure 15:
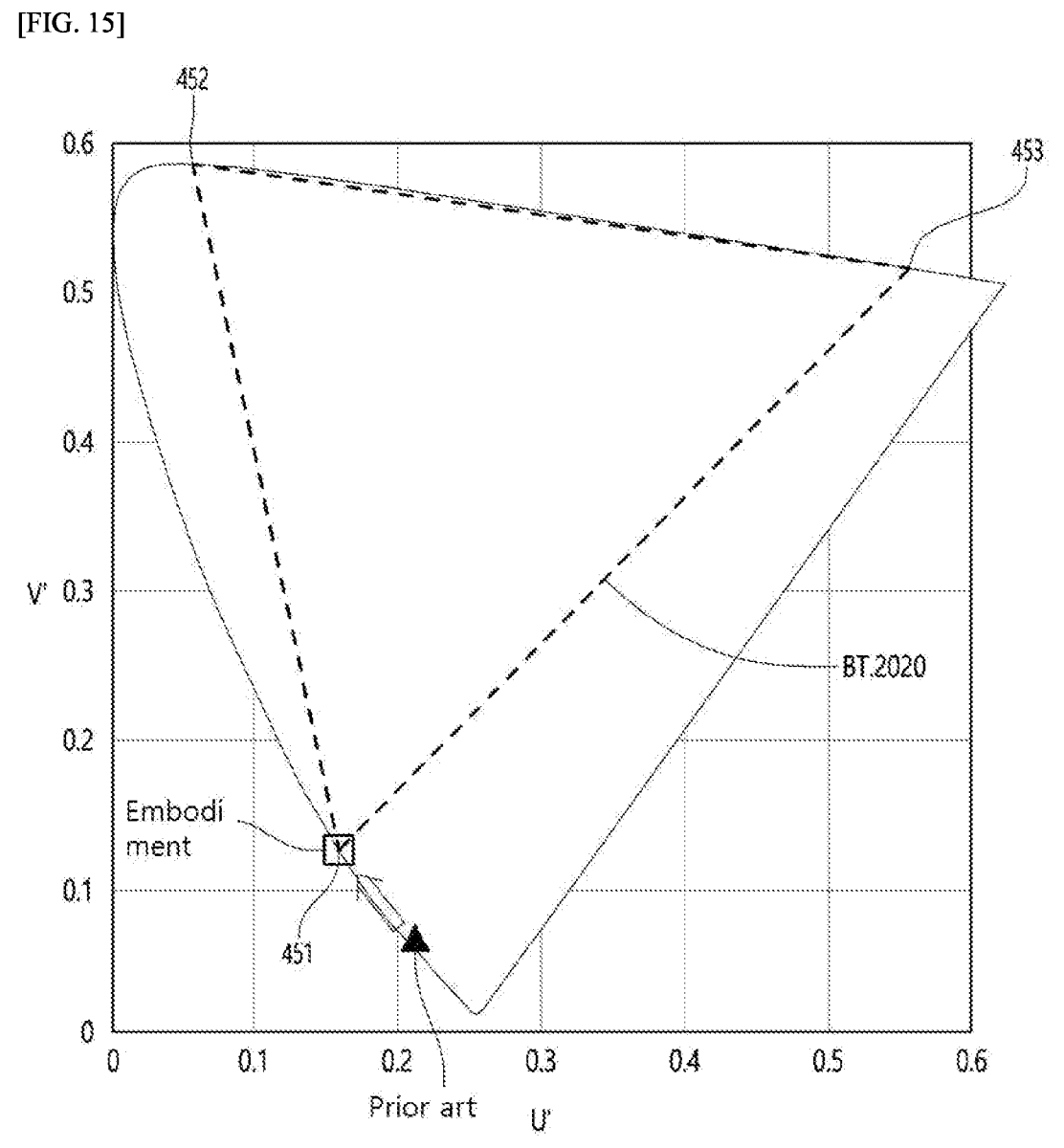

For example, the semiconductor light emitting devices 321, 322, and 323 may emit purple light, ultraviolet light, etc. for example, The dominant wavelength of the blue light 411 emitted from the semiconductor light emitting devices 321, 322, and 323 of the embodiment, as shown in FIG. 15, may be the same as the dominant wavelength of the blue light emitted from the conventional light source (see FIG. 2). In this case, the color coordinates of the dominant wavelength of the blue light 411 emitted from the semiconductor light emitting devices 321, 322, and 323 of the embodiment may be located outside the triangle formed by the color coordinates of the first color vertex 451, the second color vertex 452, and the third color vertex 453 of the BT.2020 standard. In particular, the color coordinates of the dominant wavelength of the blue light 411 emitted from the semiconductor light emitting devices 321, 322, and 323 of the embodiment may be positioned away from the color coordinates of the first color vertex 451 of the BT.2020 standard.

If, in the embodiment, a color image is implemented using the blue light 411 without separate color conversion in relation to the blue light 411, there is a problem that the color reproduction rate is lowered because the color coordinates of the dominant wavelength of the blue light 411 are located outside the triangle.

By converting the dominant wavelength to a dominant wavelength corresponding to the color coordinates of the first color vertex or nearby of the blue light 411 emitted from the semiconductor light emitting device 321 using the first conversion layer 330, the color reproduction rate of the embodiment can be improved.

The conversion layers 330 to 350 and the color filter layer may be formed integrally and attached to the substrate 310 using the adhesive member 325. Although not shown, at least one or more layers may be provided on the light source 320. For example, the layer may be a planarization layer. In this case, the conversion layers 330 to 350 may be attached to the planarization layer using the adhesive member 325.

For example, color filter layers 360 to 380 are provided, and conversion layers 330 to 350 are formed on the color filter layers 360 to 380, so that the color filter layers 360 to 380 and the conversion layers 330 to 350 may be formed integrally. Thereafter, the conversion layers 330 to 350 may be attached to the planarization layer using the adhesive member 325.

The conversion layers 330 to 350 of the embodiment may be disposed on the light source 320. For example, the conversion layers 330 to 350 may convert the first light 410 output from the light source 320 into a plurality of lights having different dominant wavelengths.

For example, the conversion layer may include a first conversion layer 330, a second conversion layer 340, and a third conversion layer 350.

The first conversion layer 330 may convert the first light 410, that is, blue light 411, output from the light source 320 into blue light 412 and green light 413, as shown in FIG. 11. The second conversion layer 340 may convert the blue light 411 output from the light source 320 into blue light 414 and green light 415. The third conversion layer 350 may convert the blue light 411 output from the light source 320 into blue light 416 and red light 417.

The first conversion layer 330 may be disposed on the first semiconductor light emitting device 321. As shown in FIG. 11, the first conversion layer 330 may convert blue light 411 into blue light 412 and green light 413. The blue light 411 emitted from the first semiconductor light emitting device 321 is excited in the first conversion layer 330, and a part of the blue light 411 is output as blue light 412, and another part of the blue light 411 may be converted to green light 413.

The second conversion layer 340 may be disposed on the second semiconductor light emitting device 322. As shown in FIG. 11, the second conversion layer 340 may convert blue light 411 into blue light 414 and green light 415. The blue light 411 emitted from the second semiconductor light emitting device 322 is excited in the first conversion layer 330, and a part of the blue light 411 is output as blue light 414, and another part of the blue light 411 may be converted to green light 415.

In FIG. 11, each arrow represents light, and the size of each arrow may indicate the intensity of each light.

Accordingly, each of the first conversion layer 330 and the second conversion layer 340 may output light including blue light 412 and 414 and green light 413 and 415. For example, the intensity of the blue light 412 output from the first conversion layer 330 may be greater than the intensity of the green light 413, and the intensity of the blue light 414 output from the second conversion layer 340 may be less than the intensity of the green light 415. For example, the intensity of the green light 413 output from the first conversion layer 330 may be 1% to 1% of the intensity of the blue light 412 output from the first conversion layer 330.

For example, the intensity of the blue light 412 output from the first conversion layer 330 may be greater than the intensity of the blue light 414 output from the second conversion layer 340, and the intensity of the green light 413 output from the first conversion layer 330 may be less than the intensity of the green light 415 output from the second conversion layer 340. For example, the blue light 411 emitted from the first and second semiconductor light emitting devices 321 and 322 may have the same intensity. For example, in the first conversion layer 330, only a portion of the blue light 411 may be converted into green light 413, and the remaining light amount may be output as blue light 412. On the other hand, in the second conversion layer 340, most of the blue light 411 may be converted into green light 415, and the remaining very small amount of light may be output as blue light 414.

To this end, the first and second conversion layers 330 and 340 may include a green conversion material.

For example, the green conversion material may be a green phosphor or a green quantum dot. For example, the green phosphor may include LuAG, Ga-YAG, β-SiAlON, silicate, etc.

In the case of green fluorescent light and green quantum dots, the wavelength waveform of green light 413 is somewhat different, as shown in FIGS. 13 and 14.

As shown in FIGS. 13 and 14, only a portion of the blue light 411 emitted from the first semiconductor light emitting device 321 may be excited and output as low-intensity green light 413, and most of the remaining light amount may be output as blue light 412. As will be explained later, the blue light 412 and green light 413 output from the first conversion layer 330 may be filtered by the first color filter 360 and output as second light 420. For example, the first color filter 360 may be designed to pass the wavelength band of the blue light 412 (471, P in FIG. 16) and the wavelength band of the green light 413 (P, 472 in FIG. 16).

As shown in FIG. 15, the dominant wavelength of the second light 420 may be the same as or close to the dominant wavelength corresponding to the color coordinate of the first color vertex 451 of the triangle of the BT.2020 standard.

Therefore, the first conversion layer 330 may convert the first light 410 into the second light 420 having a second dominant wavelength corresponding to the color coordinate of the first color vertex (451) of the triangle in the BT.2020 standard that is the same as or close to the dominant wavelength.

Excitation efficiency in the first conversion layer 330 may vary depending on the type or density of the material of the first conversion layer 330.

As shown in FIG. 10, the density of the green conversion material of the first conversion layer 330 may be lower than the density of the green conversion material of the second conversion layer 340. As the density of the green conversion material decreases, the excitation efficiency of the blue light 411 output from the first semiconductor light emitting device 321 may decrease.

Therefore, the density of the green conversion material of the first conversion layer 330 is made low, so that only a very small amount of blue light 411 may be converted into green light 413 in the first conversion layer 330, and most of the remaining blue light 411 may be output as is. The first color filter 360 may pass both the blue light 412 and the green light 413 and output the second light 420, which is a mixed light of the blue light 412 and the green light 413.

In addition, the density of the green conversion material of the second conversion layer 340 is made high, so that most of the light amount of blue light 411 may be converted to green light 415 in the second conversion layer 340, and the remaining small amount of light may be output as blue light 414. The second color filter 370 blocks the blue light 414 among the blue light 414 and the green light 415 and may pass only the green light 415 to produce the third light 430 containing only the green light 415.

Table 1 shows the wavelength characteristics of the first light 410 and the second light 420. The wavelength characteristics were output using CS-2000, a type of PL measurement equipment.

TABLE 1

| | Optical characteristics after transmission through color filter | | | |
|---|---|---|---|---|
| | dominant wavelength (nm) | FWHM(nm) | x | y |
| First light (410) | 452 | 15.6 | 0.1564 | 0.0209 |
| Second light (420)(green phosphor) | 462 | 17.5 | 0.1497 | 0.0472 |
| Second light (420)(green quantum dots) | 458.5 | 18.3 | 0.1535 | 0.0393 |

In Table 1, the first light 410 may be an optical characteristic measured by placing an arbitrary color filter on the first semiconductor light emitting device.

The color coordinates shown in FIG. 15 are U'V' color coordinates. Therefore, in Table 1, the x and y values may be converted to U'V' color coordinates by a known conversion formula to be applied to FIG. 15.

As shown in Table 1, when the green phosphor is included in the first conversion layer 330, the first light 410 having a first dominant wavelength of 452 nm may be converted into the second light having a second dominant wavelength of 462 nm. At this time, the xy color coordinate are (0.1497, 0.0472), and when converted to U'V' color coordinate, (0.1497, 0.0472) may be the second color coordinate of the first color vertex 451 of the triangle of BT.2020 or the color coordinate near the second color coordinate, as shown in FIG. 15.

When green quantum dots are included in the first conversion layer 330, the first light 410 having a first dominant wavelength of 452 nm may be converted into the second light 420 having a second dominant wavelength of 458.5 nm. At this time, the xy color coordinates are (0.1535, 0.0393), and when converted to U'V' color coordinates, (0.1535, 0.0393) may be the second color coordinate of the first color vertex 451 of the triangle of BT.2020 or the color coordinate near the second color coordinate, as shown in FIG. 15.

Table 2 shows the xy color coordinates of the third light 430 and the fourth light 440 of the example.

TABLE 2

| Third light (430) | | Fourth light (440) | |
|---|---|---|---|
| x | y | x | y |
| 0.2204 | 0.6851 | 0.6805 | 0.2996 |

As shown in Table 2, when the color coordinates (0.2204, 0.6851) of the third light 430 are converted to U'V' color coordinates, the third light 430 may be the third color coordinate of the second color vertex 452 of the triangle of BT.2020 shown in FIG. 15 or a color coordinate near the third color coordinate. As shown in Table 2, when the color coordinates (0.6805, 0.2996) of the third light 430 are converted to U'V' color coordinates, the fourth light 440 may be the fourth color coordinate of the third color vertex 453 of the triangle of BT.2020 shown in FIG. 15 or a color coordinate near the fourth color coordinate.

Table 3 shows the color reproduction rate in various standards.

TABLE 3

| | NTSC Color reproduction area ratio | color reproduction rate(DCI-P3 overlap rate) | color reproduction rate(BT.2020 overlap rate) |
|---|---|---|---|
| First light (410) | 144.5% | 95.0% | 82.9% |
| Second light (420) (green phosphor) | 126.2% | 96.3% | 82.9% |
| Second light (420) (green quantum dots) | 126.2% | 95.2% | 83.2% |

As shown in Table 3, when using the first light 410 as blue light as in the prior art to implement a color image, the DCI-P3 overlap ratio is 95%, as in the embodiment, when the second light is blue light and used to implement a color image, it is 96.3% or 95.2%, and a higher overlap ratio is shown in the example compared to the prior art, so a better color reproduction rate can be obtained. As shown in Table 3, when using the first light 410 as blue light as in the past to implement a color image, the BT.2020 overlap ratio is 82.9%, as in the embodiment, when the second light 420 is used as blue light to implement a color image, it is 83.2%, and a higher overlap ratio is shown in the embodiment compared to the prior art, so a better color reproduction rate can be obtained.

Meanwhile, the third conversion layer 350 may be disposed on the third semiconductor light emitting device 323.

The third conversion layer 350 may include a red conversion material. The red conversion material may include red phosphors or red quantum dots.

Blue light 411 may be emitted from the third semiconductor light emitting device 323.

In the third conversion layer 350, most of the blue light 411 may be converted into red light 417, and a very small amount of light may be output as blue light 416. The third color filter 380 blocks the blue light 416 and may pass only the red light 417 among the blue light 416 and the red light 417, thereby outputting the fourth light 440 containing only the red light 417.

As shown in FIG. 15, the first light 410 is light output from the light source 320 and may be located outside the triangle of the BT.2020 standard (part indicated prior art).

According to the embodiment, the second conversion layer 340 may be disposed on the second semiconductor light emitting device 322, and the third conversion layer 350 may be disposed on the third semiconductor light emitting device 323. By the second conversion layer 340, the first light 410 may be converted into the second light 420 having a third dominant wavelength corresponding to the third color coordinate of the second color vertex 452 of the triangle in the BT.2020 standard or a dominant wavelength adjacent to the third dominant wavelength. By the third conversion layer 350, the first light 410 may be converted into the fourth light 440 having a fourth dominant wavelength corresponding to the fourth color coordinate of the third color vertex 453 of the triangle of the BT.2020 standard or a dominant wavelength adjacent to the fourth dominant wavelength.

In particular, according to the embodiment, the first conversion layer 330 may be disposed on the first semiconductor light emitting device 321. By the first conversion layer 330, the first light 410 may be converted into the second light 420 having a second dominant wavelength corresponding to the second color coordinate of the first color vertex 451 of the triangle in the BT.2020 standard or a dominant wavelength adjacent to the second dominant wavelength.

Therefore, the first conversion layer 330, the second conversion layer 340 and the third conversion layer 350 output color light with a dominant wavelength corresponding to the color coordinates of each color vertex of the triangle of the BT.2020 standard, thereby achieving perfect color reproduction.

Meanwhile, the color filter layers 360 to 380 may be disposed on the conversion layers 330 to 350. The color filter layers 360 to 380 may output only a specific wavelength band of the light output from the conversion layers 330 to 350 and may block other wavelength bands.

For example, the color filter layer may include a first color filter 360, a second color filter 370, and a third color filter 380.

For example, The first color filter 360 may pass the blue light (412 in FIG. 11) and the green light 413 output from the first conversion layer 330 as is and output it as second light 420. That is, the first color filter 360 may output the second light 420 having a second frequency corresponding to the second color coordinate of the first color vertex 451 of the triangle of the BT.2020 standard or a frequency adjacent to the second frequency by selectively filtering the blue light (412 in FIG. 11) and the green light 413 output from the first conversion layer 330.

For example, the second color filter 370 may output green light 415 as third light 430 among the blue light (414 in FIG. 11) and green light 415 output from the second conversion layer 340. That is, the second color filter 370 may output the second light 420 having a third frequency corresponding to the third color coordinate of the second color vertex 452 of the triangle of the BT.2020 standard or a frequency adjacent to the third frequency by selectively filtering the blue light (414 in FIG. 11) and the green light 415 output from the second conversion layer 340.

For example, the third color filter 380 may output red light 417 as fourth light 440 among the blue light (416 in FIG. 11) and red light 417 output from the third conversion layer 350. That is, the third color filter 380 may output the fourth light 440 having a fourth frequency corresponding to the fourth color coordinate of the third color vertex 453 of the triangle of the BT.2020 standard or a frequency adjacent to the fourth frequency by selectively filtering the blue light (416 in FIG. 11) and the red light 417 output from the third conversion layer 350.

Meanwhile, as shown in FIG. 15, the second light 420 may have a second dominant wavelength corresponding to the second color coordinate of the first color vertex 451 of the triangle in the BT.2020 standard or may have a dominant wavelength adjacent to the second dominant wavelength. For example, the second light 420 may have a third dominant wavelength corresponding to the third color coordinate of the second color vertex 452 of the triangle in the BT.2020 standard or may have a dominant wavelength adjacent to the third dominant wavelength. For example, the fourth light 440 may have a fourth dominant wavelength corresponding to the fourth color coordinate of the third color vertex 453 of the triangle of the BT.2020 standard or a dominant wavelength adjacent to the fourth dominant wavelength.

The second dominant wavelength may be larger than the first dominant wavelength, the third dominant wavelength may be larger than the second dominant wavelength, and the fourth dominant wavelength may be larger than the third dominant wavelength. For example, the first dominant wavelength may be set in the range of 380 nm to 460 nm, and the second dominant wavelength may be set in the range of 460 nm to 480 nm. The third dominant wavelength may be set in the range of 520 nm to 550 nm, and the fourth dominant wavelength may be set in the range of 600 nm to 640 nm.

In the above, the BT.2020 standard is used as an example, but the embodiment may also be applied to the NTSC standard, DCI-P3 standard, and BT.709. BT.709 may be called Rec.709, and BT.2020 may be called Rec.2020.

The first color filter 360, the second color filter 370, and the third color filter 380 may be formed of a transparent material that allows light to pass through.

For example, at least one of the first color filter 360, the second color filter 370, and the third color filter 380 may include quantum dots.

Quantum dots in examples may be selected from Group II-IV compounds, Group III-V compounds, Group IV-VI compounds, Group IV elements, Group IV compounds, and combinations thereof.

The color filter layer may include a black matrix 390. For example, the black matrix 390 may surround each of the first color filter 360, the second color filter 370, and the third color filter 380. The black matrix 390 has a light absorption function, the contrast ratio can be improved by preventing crosstalk between the second to fourth lights 420, 430 and 440 output from the first color filter 360, the second color filter 370, and the third color filter 380.

Meanwhile, although not shown, the substrate 310 is disposed on the color filter layers 360 to 380 to protect the color filter layers 360 to 380. The substrate 310 may be made of glass or resin, but is not limited thereto. The substrate 310 may be called a cover window, cover glass, etc.

As shown in FIG. 16, in the embodiment, the first light 410 may have a first wavelength band having a first lower limit value 161 and a first upper limit value 462.

In an embodiment, the second light 420 may have a second wavelength band having a second lower limit value 471 and a second upper limit value 472. For example, the second wavelength band may include the first wavelength band. The second wavelength band may have a critical wavelength value P, which is an inflection point of the wavelength, between the second lower limit value 471 and the second upper limit value 472.

For example, a second-first wavelength band between the second lower limit value 471 of the second wavelength band and the critical wavelength value P is the same as the first wavelength band of the first light 410, the second-first wavelength band may be the wavelength band of the first light 410 output as is without conversion of the first light 410 in the first conversion layer 330. For example, a second-second wavelength band between the critical wavelength value P of the second wavelength band and the second upper limit value 472 may be a wavelength band in which a partial amount of first light 410 is converted and output in the first conversion layer 330.

For example, the light in the second-first wavelength band may be blue light 412, and the ball in the second-second wavelength band may be green light 413. In this case, the intensity of the green light 413 of the second light 420 may be 1% to 10% of the intensity of the blue light 412 of the second light 420. The first dominant wavelength of the first light 410 output from the first semiconductor light emitting device 321 by light in the second-second wavelength band may be converted into a second dominant wavelength of the second light 420 by the first conversion layer 330 and the first color filter 360. That is, as shown in FIG. 15, when located at the color coordinate corresponding to the first dominant wavelength of the first light 410 output from the conventional first semiconductor light emitting device 321 without the first conversion layer 330, the first dominant wavelength of the first light 410 may be converted into a second dominant wavelength of the second light 420 by the first conversion layer 330 and positioned in second color coordinates of the first color vertex 451 of the triangle in the BT.2020 standard.

In an embodiment, the second light 420 may have a third wavelength band having a third lower limit value 491 and a third upper limit value 492.

For example, the second upper limit value 472 of the second wavelength band of the second light 420 may be greater than the first upper limit value 462 of the first wavelength band of the first light 410. For example, the critical wavelength value P of the second wavelength band of the second light 420 may be equal to the upper limit value 462 of the first wavelength band of the first light 410. Therefore, the first dominant wavelength of the first light 410 may be converted into the second dominant wavelength of the second light 420 by a second-second wavelength band corresponding to between the critical wavelength value P and the second upper limit value 472 in the second wavelength band of the second light 420

For example, the third wavelength band of the second light 420 may overlap with the second wavelength band of the second light 420. For example, the third upper limit value 482 of the third wavelength band of the second light 420 may be greater than the second upper limit value 472 of the second wavelength band of the second light 420.

FIG. 17 shows a transmission section according to the wavelength of a color filter according to an embodiment.

For example, as shown in FIG. 17, each of the first color filter 360, the second color filter 370, and the third color filter 380 may be designed to have a transmittance of 50%, but this is not limited.

For example, the first color filter 360 filters the blue light 412 and the green light 413 output from the first conversion layer 330 and, for example, may transmit light with a wavelength of 539 nm or less. That is, the first color filter 360 may have an upper limit of 539 nm. The lower limit of the first color filter 360 may or may not exist. Accordingly, the first color filter 360 may pass the blue light 412 and green light 413 output from the first conversion layer 330 as is and output them as second light 420.

For example, the second color filter 370 filters the blue light 414 and the green light 415 output from the second conversion layer 340, for example, may transmit light having a wavelength corresponding to 480 nm to 597 nm. That is, the second color filter 370 may have a lower limit of 480 nm and an upper limit of 597 nm. Accordingly, the second color filter 370 may block blue light with a wavelength of less than 480 nm among the blue light 414 and green light 415 output from the second conversion layer 340, and may pass green light with a wavelength of 480 nm or more, thereby outputting green light with a wavelength of 480 nm or more as the second light 420.

For example, the third color filter 380 filters the blue light 416 and the red light 417 output from the third conversion layer 350 and, for example, may transmit light with a wavelength of 606 nm or more. That is, the third color filter 380 may have a lower limit of 606 nm. The upper limit value of the third color filter 380 may or may not exist.

Accordingly, the third color filter 380 may output red light with a wavelength of 606 nm or more among the blue light 416 and the red light 417 output from the third conversion layer 350 as the fourth light 440.

As shown in FIGS. 15 and 17, the first light 410 transmitted by the first color filter 360 is located in the second color coordinate of the first color vertex 451 of the triangle of BT.2020, the second light 420 transmitted by the second color filter 370 is located in the third color coordinate of the second color vertex 452 of the triangle of BT.2020, the second light 420 transmitted by the third color filter 380 is located according to the fourth color coordinate of the third color vertex 453 of the triangle of BT.2020, thereby improving color reproduction rate.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

INDUSTRIAL APPLICABILITY

The embodiment may be adopted in the field of displays that display images or information.

The embodiment may be adopted in the field of displays that display images or information using semiconductor light emitting devices.

The invention claimed is:

1. A display device for displaying a color image with a color gamut standard defined by a triangle connecting a first color vertex, a second color vertex, and a third color vertex, the display device comprising: a substrate; a light source disposed on the substrate and generating first light of a first dominant wavelength corresponding to a first color coordinate located outside the triangle and spaced apart from the first color vertex; a conversion layer disposed on the substrate to convert the first light into a plurality of lights having different dominant wavelengths; and a color filter layer disposed on the conversion layer, wherein the light source comprises a plurality of semiconductor light emitting devices disposed on a plurality of color areas of the substrate, wherein the conversion layer comprises: a first conversion layer disposed on at least one first color area among the plurality of color areas of the substrate to convert the first light into a second light of a second dominant wavelength corresponding to the second color coordinate of the first color vertex and output the first light and the second light; a second conversion layer disposed on at least one second color area among the plurality of color areas of the substrate to convert the first light into a third light of a third dominant wavelength corresponding to the third color coordinate of the second color vertex and output the first light and the third light; and a third conversion layer disposed on at least one third color area among the plurality of color areas of the substrate to convert the first light into a fourth light of a fourth dominant wavelength corresponding to the fourth color coordinate of the third color vertex and output the first light and the fourth light, and wherein the first conversion layer and the second conversion layer include the same material.

2. The display device according to claim 1, wherein the first light is a blue light, and wherein each of the second and third lights is a mixed light of blue light and green light.

3. The display device according to claim 2, wherein the second light has a greater intensity of the blue light than the intensity of the green light, and wherein the third light has a greater intensity of the green light than the intensity of the blue light.

4. The display device according to claim 3, wherein the intensity of the green light is 1% to 10% of the intensity of the blue light in the second light.

5. The display device according to claim 1, wherein a second upper limit of the second wavelength band of the second light is greater than a first upper limit of the first wavelength band of the first light.

6. The display device according to claim 5, wherein the third wavelength band of the third light overlaps the second wavelength band of the second light.

7. The display device according to claim 6, wherein an upper limit of the third wavelength band of the third light is greater than that of the second wavelength band of the second light.

8. The display device according to claim 1, wherein the first conversion layer and the second conversion layer comprise green phosphor.

9. The display device according to claim 8, wherein a density of the green phosphor in the first conversion layer is lower than that of the green phosphor in the second conversion layer.

10. The display device according to claim 8, wherein the second color coordinate is (0.1497, 0.0472).

11. The display device according to claim 1, wherein the first conversion layer and the second conversion layer include green quantum dots.

12. The display device according to claim 11, wherein a density of green quantum dots of the first conversion layer is lower than that of green quantum dots of the second conversion layer.

13. The display device according to claim 11, wherein the second color coordinate is (0.1535, 0.0393).

14. The display device according to claim 1, wherein the second dominant wavelength is greater than the first dominant wavelength, wherein the third dominant wavelength is greater than the second dominant wavelength, and wherein the fourth dominant wavelength is greater than the third dominant wavelength.

15. The display device according to claim 1, wherein the first dominant wavelength is set in the range of 380 nm to 460 nm, wherein the second dominant wavelength is set in the range of 460 nm to 480 nm, wherein the third main wavelength is set in the range of 520 nm to 550 nm, wherein the fourth dominant wavelength is set in the range of 600 nm to 640 nm.

16. The display device according to claim 1, the color filter layer comprises:

a first color filter disposed on the first conversion layer to output the second light;

a second color filter disposed on the second conversion layer to output the third light; and a third color filter disposed on the third conversion layer to output the fourth light.

17. The display device according to claim 16, wherein the first color filter has an upper limit of 539 nm, wherein the second color filter has a lower limit of 480 nm and an upper limit of 597 nm.

18. The display device according to claim 1, wherein the semiconductor light emitting device comprises one of a micrometer-level semiconductor light emitting device or a nanometer-level semiconductor light emitting device.

19. The display device according to claim 1, wherein the color reproduction rate standard is one of the NTSC standard, DCI-P3 standard, BT.709 (or Rec. 709) standard, and BT.2020 (or Rec. 2020) standard.

* * * * *